(12) United States Patent
Sandhu et al.

(10) Patent No.: US 8,003,310 B2
(45) Date of Patent: Aug. 23, 2011

(54) MASKING TECHNIQUES AND TEMPLATES FOR DENSE SEMICONDUCTOR FABRICATION

(75) Inventors: Gurtej S. Sandhu, Boise, ID (US); Ardavan Niroomand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1514 days.

(21) Appl. No.: 11/410,588

(22) Filed: Apr. 24, 2006

(65) Prior Publication Data
US 2007/0261016 A1  Nov. 8, 2007

(51) Int. Cl.
*G03F 7/26* (2006.01)

(52) U.S. Cl. ......... 430/323; 430/320; 430/324; 430/256

(58) Field of Classification Search .................. 430/313, 430/323, 322, 314, 324, 320
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,648,937 A | 3/1987 | Ogura et al. | |
| 4,716,131 A | 12/1987 | Okazawa et al. | |
| 4,776,922 A | 10/1988 | Bhattacharyya et al. | |
| 4,838,991 A | 6/1989 | Cote et al. | |
| 5,013,680 A | 5/1991 | Lowrey et al. | |
| 5,053,105 A | 10/1991 | Fox, III | |
| 5,117,027 A | 5/1992 | Bernhardt et al. | |
| 5,328,810 A | 7/1994 | Lowrey et al. | |
| 5,330,879 A | 7/1994 | Dennison | |
| 5,470,661 A | 11/1995 | Bailey et al. | |
| 5,514,885 A | 5/1996 | Myrick | |
| 5,593,813 A | 1/1997 | Kim | |
| 5,670,794 A | 9/1997 | Manning | |
| 5,753,546 A | 5/1998 | Koh et al. | |
| 5,789,320 A | 8/1998 | Andricacos et al. | |
| 5,795,830 A | 8/1998 | Cronin et al. | |
| 5,830,332 A | 11/1998 | Babich et al. | |
| 5,899,746 A | 5/1999 | Mukai | |

(Continued)

FOREIGN PATENT DOCUMENTS
DE  42 36 609 A1  5/1994
(Continued)

OTHER PUBLICATIONS

Final Office Action issued Mar. 29, 2010 in U.S. Appl. No. 11/669,840.
U.S. Appl. No. 11/543,515, filed Oct. 24, 2006.
Ex Parte Cantell, unpublished decision of the Board of Patent Appeals and Interferences, Mar. 4, 2005.

(Continued)

*Primary Examiner* — Kathleen Duda
*Assistant Examiner* — Caleen O Sullivan
(74) *Attorney, Agent, or Firm* — Knobbe, Martens, Olson & Bear LLP

(57) ABSTRACT

A template comprising pitch multiplied and non-pitch multiplied features is configured for use in imprint lithography. On a first substrate, a first pattern is formed using pitch multiplication and a second pattern is formed using photolithography without pitch multiplication. The first pattern and the second pattern are transferred to a template. The template is brought into contact with a transfer layer overlying a series of mask layers overlying a second substrate. The pitch multiplied and non-pitch multiplied patterns on the template are transferred to the transfer layer, forming an imprinted pattern. The imprinted pattern is transferred to the second substrate to form pitch multiplied and non-pitch multiplied features.

8 Claims, 33 Drawing Sheets

U.S. PATENT DOCUMENTS

| | | |
|---|---|---|
| 5,998,256 A | 12/1999 | Juengling |
| 6,004,862 A | 12/1999 | Kim et al. |
| 6,010,946 A | 1/2000 | Hisamune et al. |
| 6,042,998 A | 3/2000 | Brueck et al. |
| 6,057,573 A | 5/2000 | Kirsch et al. |
| 6,060,383 A | 5/2000 | Nogami et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,207,490 B1 | 3/2001 | Lee et al. |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor, Jr. et al. |
| 6,372,649 B1 | 4/2002 | Han et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,500,756 B1 | 12/2002 | Bell et al. |
| 6,514,884 B2 | 2/2003 | Maeda |
| 6,522,584 B1 | 2/2003 | Chen et al. |
| 6,531,067 B1 | 3/2003 | Shiokawa et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,730,571 B1 | 5/2004 | Chan et al. |
| 6,734,107 B2 | 5/2004 | Lai et al. |
| 6,744,094 B2 | 6/2004 | Forbes |
| 6,773,998 B1 | 8/2004 | Fisher et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,924,191 B2 | 8/2005 | Liu et al. |
| 6,955,961 B1 | 10/2005 | Chung |
| 6,962,867 B2 | 11/2005 | Jackson et al. |
| 7,015,124 B1 | 3/2006 | Fisher et al. |
| 7,074,668 B1 | 7/2006 | Park et al. |
| 7,084,076 B2 | 8/2006 | Park et al. |
| 7,183,205 B2 | 2/2007 | Hong |
| 7,183,597 B2 | 2/2007 | Doyle |
| 7,208,379 B2 | 4/2007 | Venugopal et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,537,866 B2 | 5/2009 | King Liu |
| 7,687,408 B2 * | 3/2010 | Abatchev et al. ............. 438/751 |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura |
| 2003/0006410 A1 | 1/2003 | Doyle |
| 2003/0044722 A1 | 3/2003 | Hsu et al. |
| 2003/0090002 A1 | 5/2003 | Sugawara et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0087892 A1 | 4/2005 | Hsu et al. |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0167394 A1 | 8/2005 | Liu et al. |
| 2005/0186705 A1 | 8/2005 | Jackson et al. |
| 2005/0230882 A1 * | 10/2005 | Watts et al. ................... 264/496 |
| 2005/0272259 A1 | 12/2005 | Hong |
| 2006/0003182 A1 | 1/2006 | Lane et al. |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0234138 A1 | 10/2006 | Fehlhaber et al. |
| 2006/0261392 A1 | 11/2006 | Lee et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0018345 A1 | 1/2007 | Chao |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0200178 A1 | 8/2007 | Yun et al. |
| 2007/0210449 A1 | 9/2007 | Caspary et al. |
| 2007/0215874 A1 | 9/2007 | Furukawa et al. |
| 2007/0215960 A1 | 9/2007 | Zhu et al. |
| 2007/0275309 A1 | 11/2007 | Liu |
| 2008/0011998 A1 | 1/2008 | Lung |
| 2008/0054350 A1 | 3/2008 | Breitwisch et al. |
| 2009/0258492 A1 | 10/2009 | Sant et al. |

FOREIGN PATENT DOCUMENTS

| | | |
|---|---|---|
| EP | 0227303 | 7/1987 |
| EP | 0491408 | 6/1992 |
| EP | 1357433 | 10/2003 |
| JP | 57-048237 | 3/1982 |
| JP | 05343370 | 12/1993 |
| JP | H8-55908 | 2/1996 |
| JP | H8-55920 | 2/1996 |
| JP | 2004-152784 | 5/2004 |
| KR | 1999-0001440 | 1/1999 |
| KR | 1999-027887 | 4/1999 |
| TW | 376582 | 12/1999 |
| WO | WO 94/15261 | 7/1994 |
| WO | WO 02/099864 A1 | 12/2002 |
| WO | WO 2004/001799 A2 | 12/2003 |

| | | |
|---|---|---|
| WO | WO 2004/003977 | 1/2004 |
| WO | WO 2005/034215 A1 | 4/2005 |
| WO | WO 2006/026699 | 3/2006 |

OTHER PUBLICATIONS

Choi et al., "Sublithographic nanofabrication technology for nanocatalysts and DNA chips," *J. Vac. Sci. Technol.*, Nov./Dec. 2003; pp. 2951-21955.

Bruek, "Optical and Interferometric Lithography—Nanotechnology Enablers," 2005, Proceedings of the IEEE, vol. 93, No. 10, pp. 1704-1721.

Office Action of Jun. 2, 2008 in U.S. Appl. No. 11/219,067, filed Sep. 1, 2005.

Office Action of Jun. 5, 2008 in U.S. Appl. No. 11/514,117, filed Aug. 30, 2006.

Office Action of Jul. 11, 2008 in U. S. Appl. No. 11/367,020, filed Mar. 2, 2006.

Sheats et al., "Microlithography: Science and Technology," 1998, Marcel Dekkar, Inc., pp. 104-105.

Bergeron, et al., "Resolution Enhancement Techniques for the 90nm Technology Node and Beyond," Future Fab International, Issue 15, Jul. 11, 2003, 4 page.

Bhave et al., "Developer-soluble Gap fill materials for patterning metal trenches in Via-first Dual Damascene process," preprint of Proceedings of SPIE: Advances in Resist Technology and Processing XXI, vol. 5376, 2004, John L. Sturtevant, editor, 8 pages.

Chou, et al., "Nanoimprint lithography," J. Vac. Sci. Technol. B 14(6), Nov./Dec. 1996, pp. 4129-4133.

Chou, et al., "Sub-10 nm imprint lithography and applications," J. Vac. Sci. Technol. B 15(6) Nov./Dec. 1997, pp. 2897-2904.

Chung et al., "Pattern multiplication method and the uniformity of nanoscale multiple lines*," J.Vac.Sci.Technol. B21(4), Jul./Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

Joubert et al., "Nanometer scale linewidth control during etching of polysilicon gates in high-density plasmas," Microelectronic Engineering 69 (2003), pp. 350-357.

Oehrlein et al., "Pattern transfer into low dielectic materials by high-density plasma etching," Solid State Tech., May 2000, 8 pages.

* cited by examiner

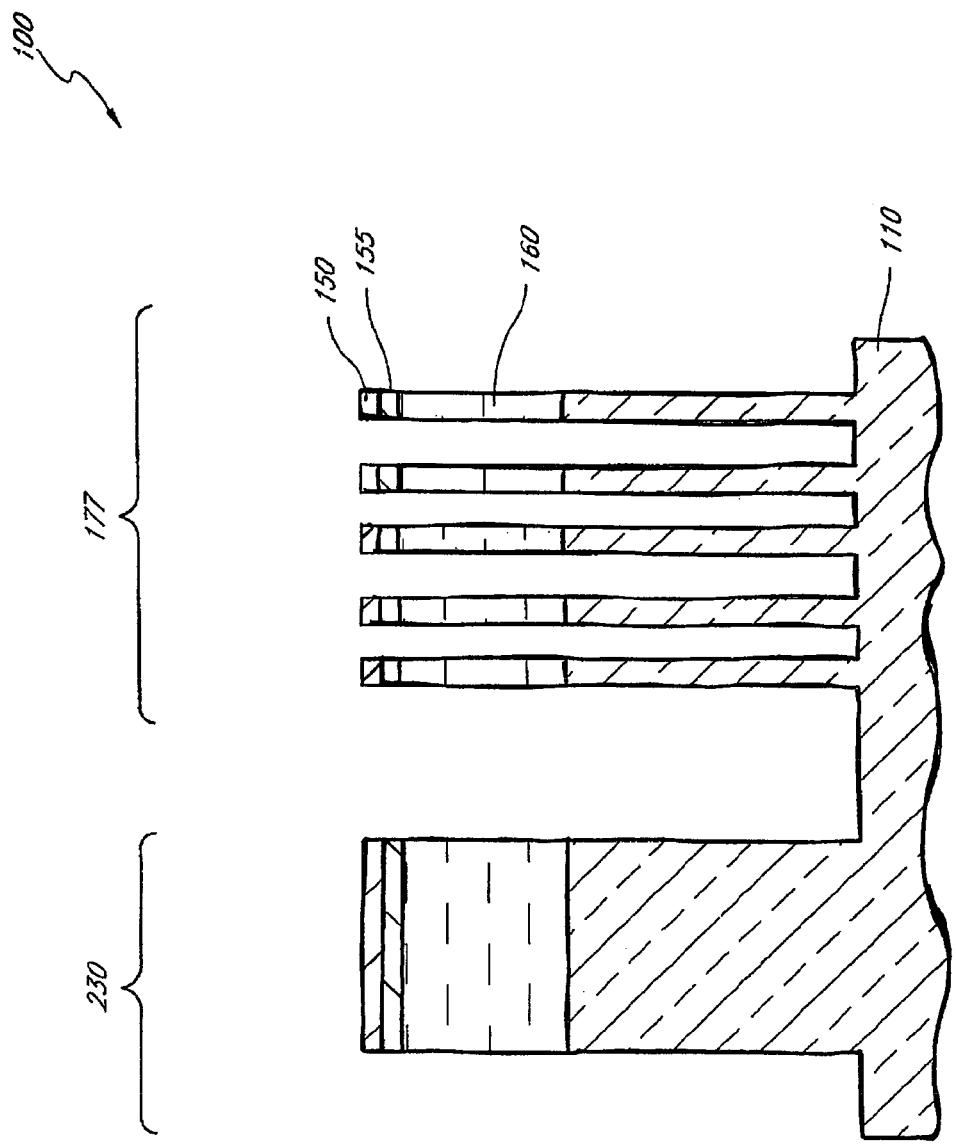

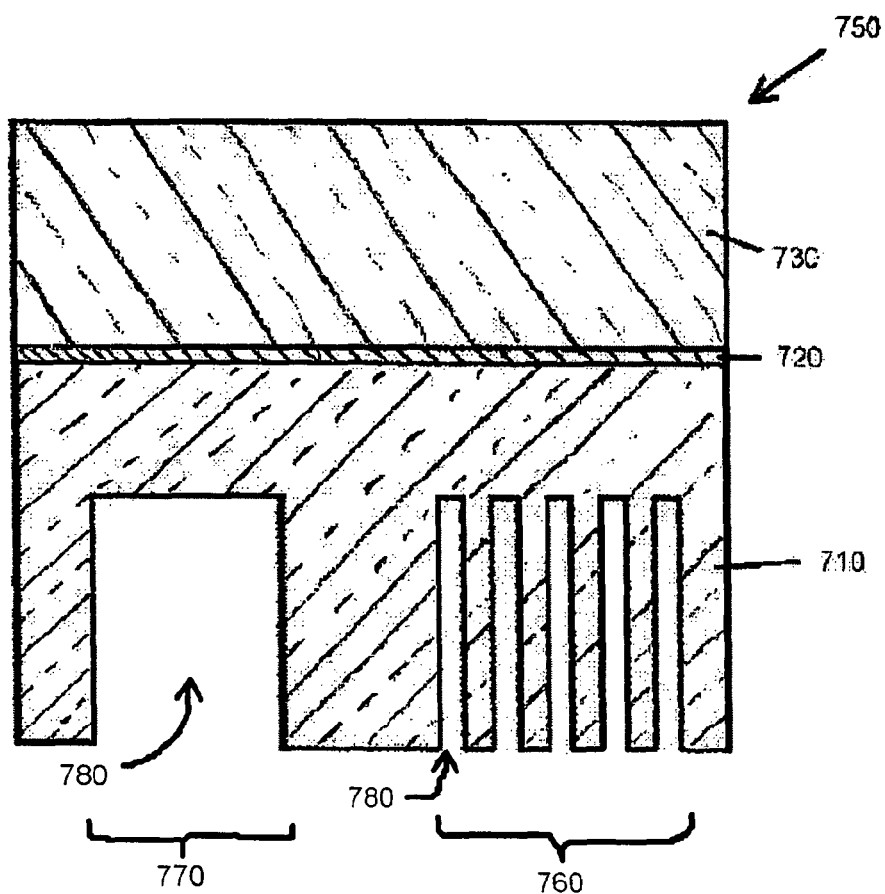
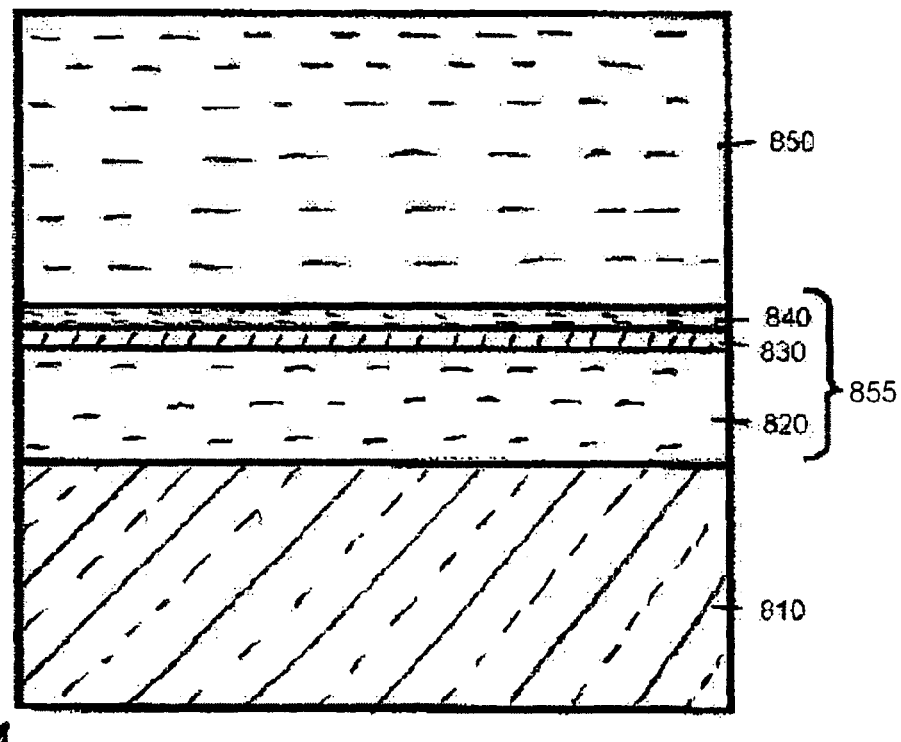
Fig. 6A

MASKING TECHNIQUES AND TEMPLATES FOR DENSE SEMICONDUCTOR FABRICATION

REFERENCE TO RELATED APPLICATIONS

This application is also related to and incorporates the following by reference in their entireties: U.S. patent application Ser. No. 10/931,771 to Tran et al., filed Aug. 31, 2004; U.S. patent application Ser. No. 10/934,778 to Abatchev et al., filed Sep. 2, 2004.

BACKGROUND OF THE INVENTION

1. Field of the Invention

This invention relates generally to masking techniques for semiconductor fabrication, and more particularly to masking techniques including pitch multiplication.

2. Description of the Related Art

As a consequence of many factors, including demand for increased portability, computing power, memory capacity and energy efficiency, integrated circuits are continuously being reduced in size. The sizes of the constituent features that form the integrated circuits, e.g., electrical devices and interconnect lines, are also constantly being decreased to facilitate this size reduction.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically comprises millions of identical circuit elements, known as memory cells. DRAM memory cells typically include two electrical devices: a storage capacitor and an access field effect transistor. Each memory cell is an addressable location that can store one bit (binary digit) of data. A bit can be written to a cell through the transistor and can be read by sensing charge in the capacitor. By decreasing the sizes of the electrical devices that constitute a memory cell and the sizes of the conducting lines that access the memory cells, the memory devices can be made smaller. Additionally, storage capacities can be increased by fitting more memory cells on a given area in the memory devices. Other examples of integrated circuit memories include MRAM (including magneto resistive elements), programmable fuse memories, programmable conductor memories (including metal-doped chalcogenide glass elements), SRAM, SDRAM, EEPROM and other volatile and non-volatile memory schemes.

Photolithography is commonly used to pattern features, such as conductive lines. The concept of pitch can be used to describe the sizes of these features. Pitch is defined as the distance between an identical point in two neighboring features. These features are typically defined by spaces between adjacent features. Spaces are typically filled by a material, such as an insulator. As a result, for regular patterns (e.g., in arrays) pitch can be viewed as the sum of the width of a feature and of the width of the space on one side of the feature separating that feature from a neighboring feature. However, due to factors such as optics and light or radiation wavelength, photolithography techniques each have a minimum pitch below which a particular photolithographic technique cannot reliably form features. Consequently, the minimum pitch of a photolithographic technique is an impediment to further feature size reduction.

"Pitch multiplication" or "pitch doubling" is one proposed method for extending the capabilities of photolithographic techniques beyond their minimum pitch. A pitch multiplication method is illustrated in FIGS. 1A-1F and described in U.S. Pat. No. 5,328,810, issued to Lowrey et al., the entire disclosure of which is incorporated herein by reference. With reference to FIG. 1A, a pattern of lines 10 is photolithographically formed in a photoresist layer, which overlies a layer 20 of an expendable material, which in turn overlies a substrate 30. As shown in FIG. 1B, the pattern is then transferred using an etch (preferably an anisotropic etch) to the layer 20, thereby forming placeholders, or mandrels, 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. Spacers 60, i.e., the material extending or originally formed extending from sidewalls of another material, are then formed on the sides of the mandrels 40. The spacer formation is accomplished by preferentially etching the spacer material from the horizontal surfaces 70 and 80 in a directional spacer etch, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by, e.g., the spacers 60. As a result, the smallest feature size possible with a photolithographic technique is effectively decreased.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. Pitch can thus be used in two converse senses: the distance between identical elements in a regular pattern and the number of features in a fixed linear distance. The conventional terminology is retained herein.

Because the layer 50 of spacer material typically has a single thickness 90 (see FIGS. 1D and 1E) and because the sizes of the features formed by the spacers 60 usually correspond to that thickness 90, pitch doubling typically produces features of only one width. Circuits, however, generally employ features of different sizes. For example, random access memory circuits typically contain arrays of memory cells located in one part of the circuits and logic circuits located in the so-called "periphery." In the arrays, the memory cells are typically connected by conductive lines and, in the periphery, the conductive lines typically contact landing pads for connecting arrays to logic. Peripheral features such as landing pads, however, should be larger than the conductive lines to facilitate contact with subsequently produced patterns (e.g., contacts from higher levels). In addition, periphery electrical devices, including peripheral transistors, can be larger and/or less dense than the electrical devices in the array. Moreover, even if peripheral features can be formed with the same pitch as features in the array, because mask patterns formed by pitch multiplication may be limited to those that are formed along the sidewalls of patterned photoresist, the flexibility, e.g., geometric flexibility, desirable to define some features is more difficult to achieve with pitch multiplication.

The reduction in feature sizes through pitch doubling and the concomitant increase in the complexity of device features may be met with an increase in the number of processing steps in semiconductor fabrication, which may in turn effect an increase in the processing time. Thus, the reduction of features sizes may increase the costs associated with semiconductor fabrication. Accordingly, there is a need for methods of forming features of different sizes, especially where some features are formed below the minimum pitch of a photolithographic technique, while minimizing the number of processing steps and/or processing time, in addition to the costs associated with semiconductor fabrication.

BRIEF DESCRIPTION OF THE DRAWINGS

The invention will be better understood from the Detailed Description of the Preferred Embodiments and from the appended drawings, which are meant to illustrate and not to limit the invention, and wherein:

FIGS. 2A-2L are schematic, cross-sectional side views of a sequence of masking patterns for forming an integrated circuit pattern including pitch multiplied and non-pitch multiplied features, in accordance with a preferred embodiment of the invention;

FIGS. 6A and 6B are schematic, cross-sectional side views of a partially formed integrated circuit before and after bringing a template into contact with a transfer layer overlying a second substrate, in accordance with a preferred embodiment of the invention;

DETAILED DESCRIPTION OF THE PREFERRED EMBODIMENTS

Figure 1A:
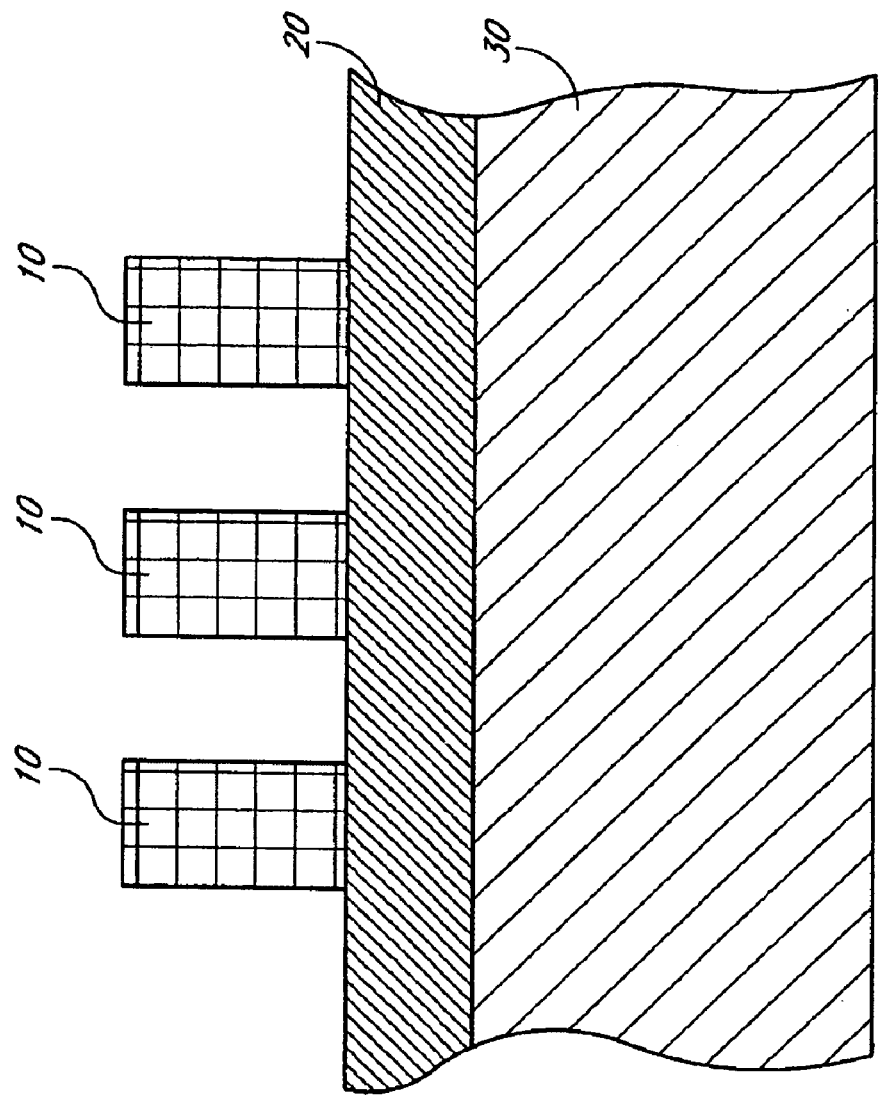
FIGS. 1A-1F are schematic, cross-sectional side views of a sequence of masking patterns for forming conductive lines, in accordance with a prior art pitch doubling method.
Figure 1B:
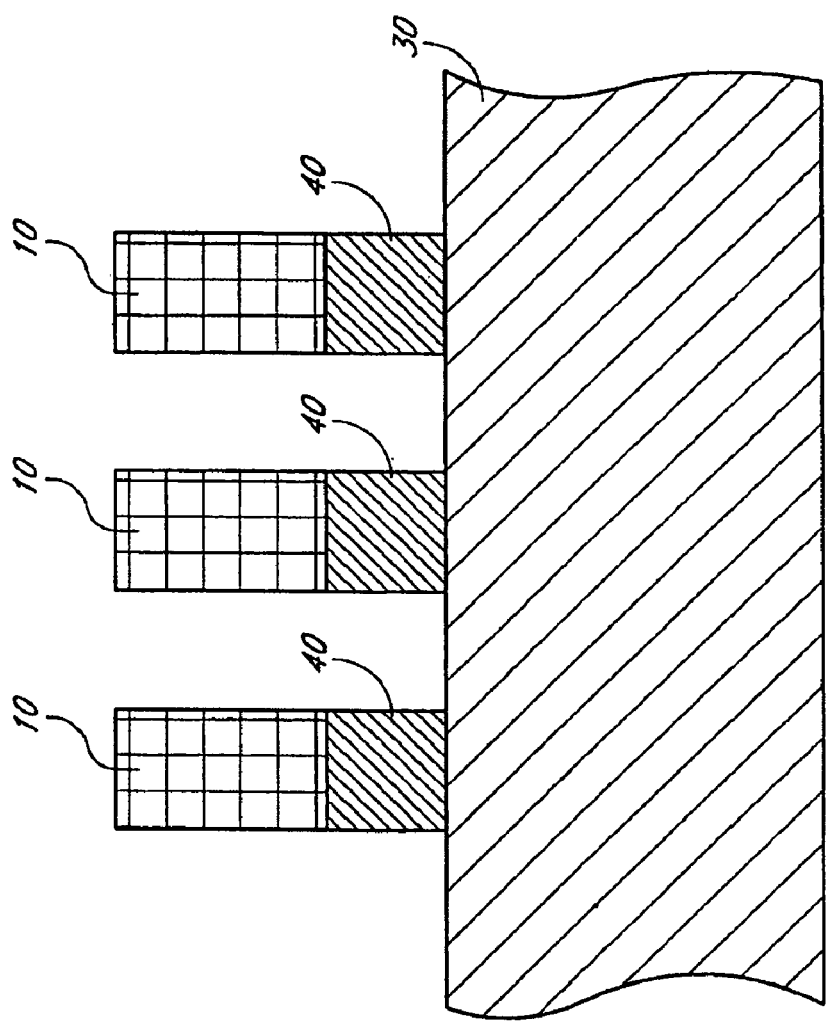
Figure 1C:
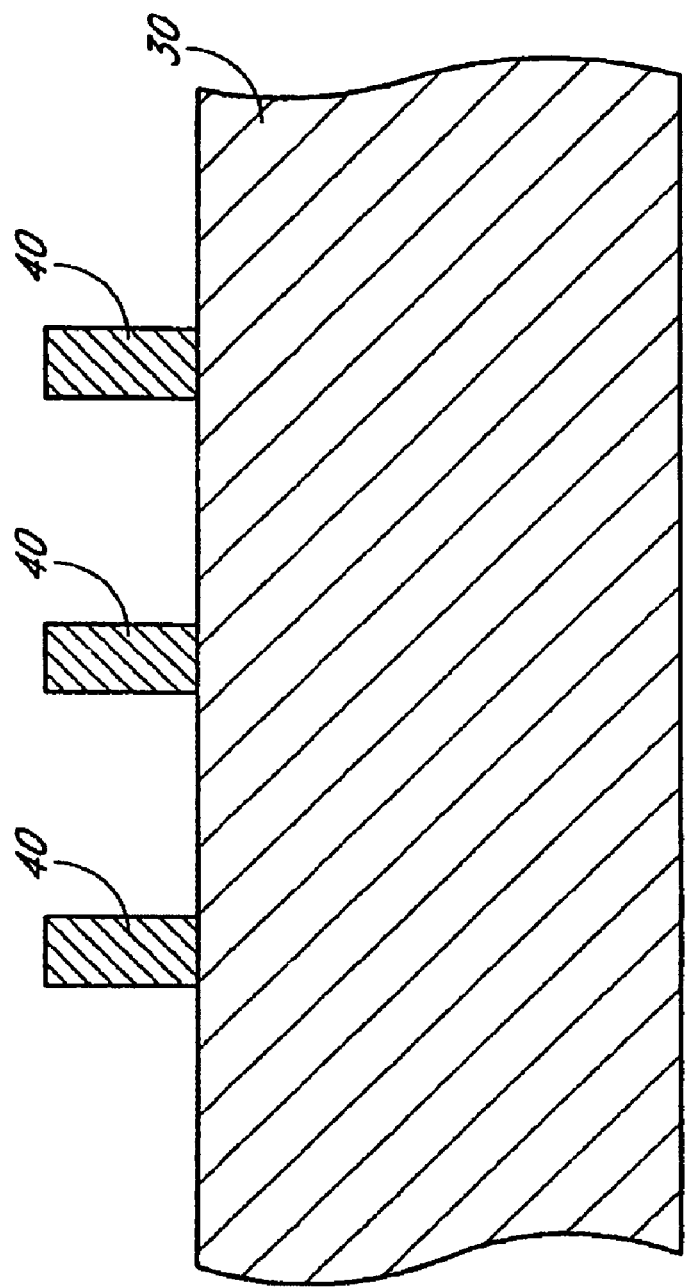
Figure 1D:
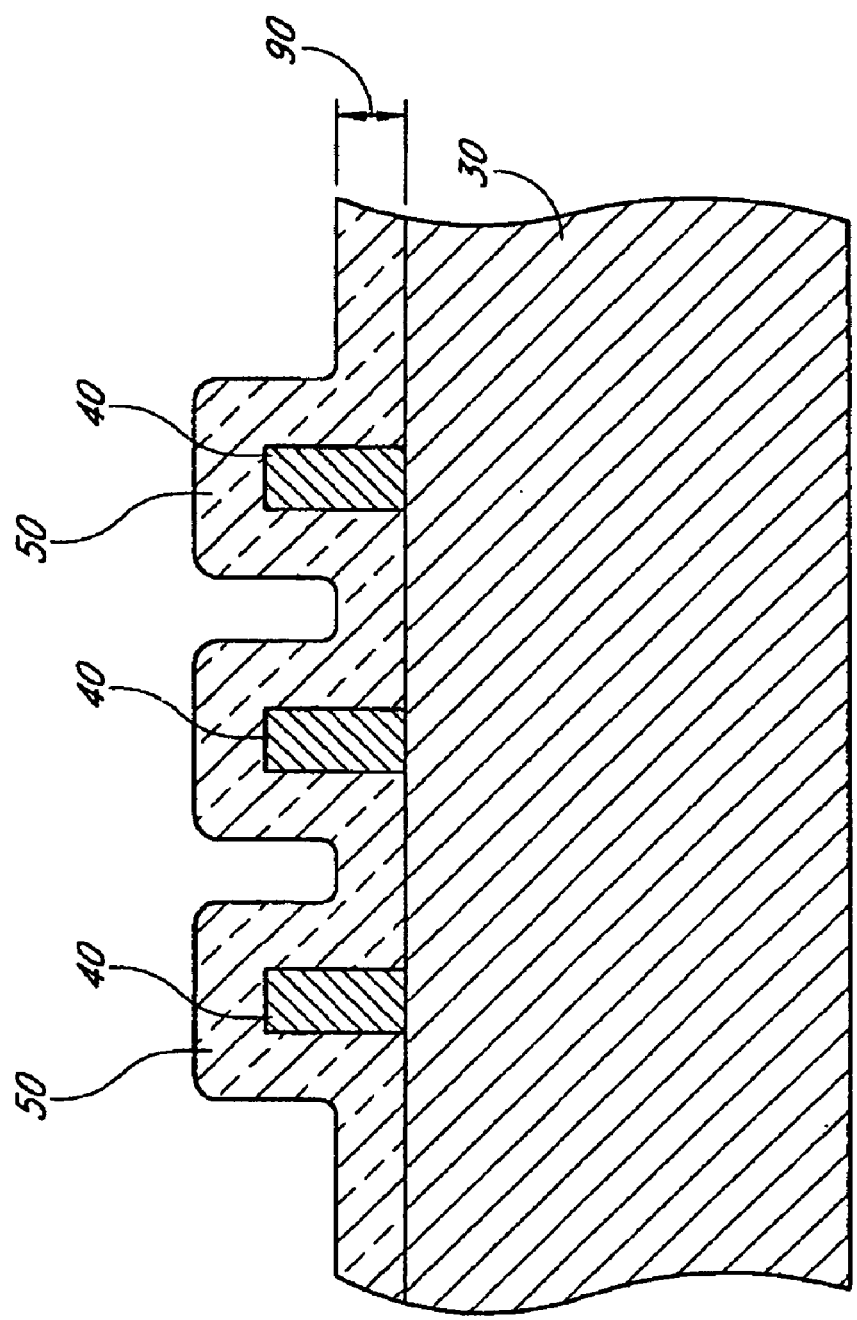
Figure 1E:
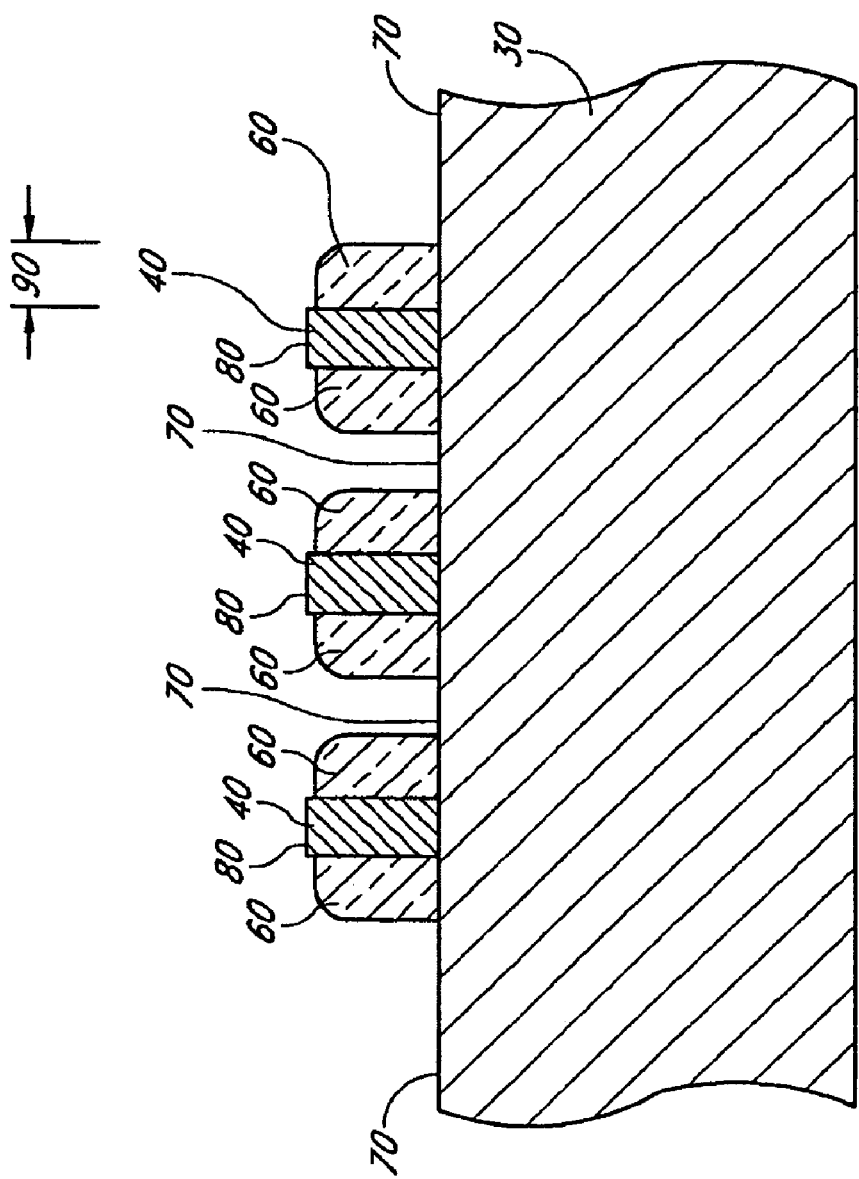
Figure 1F:
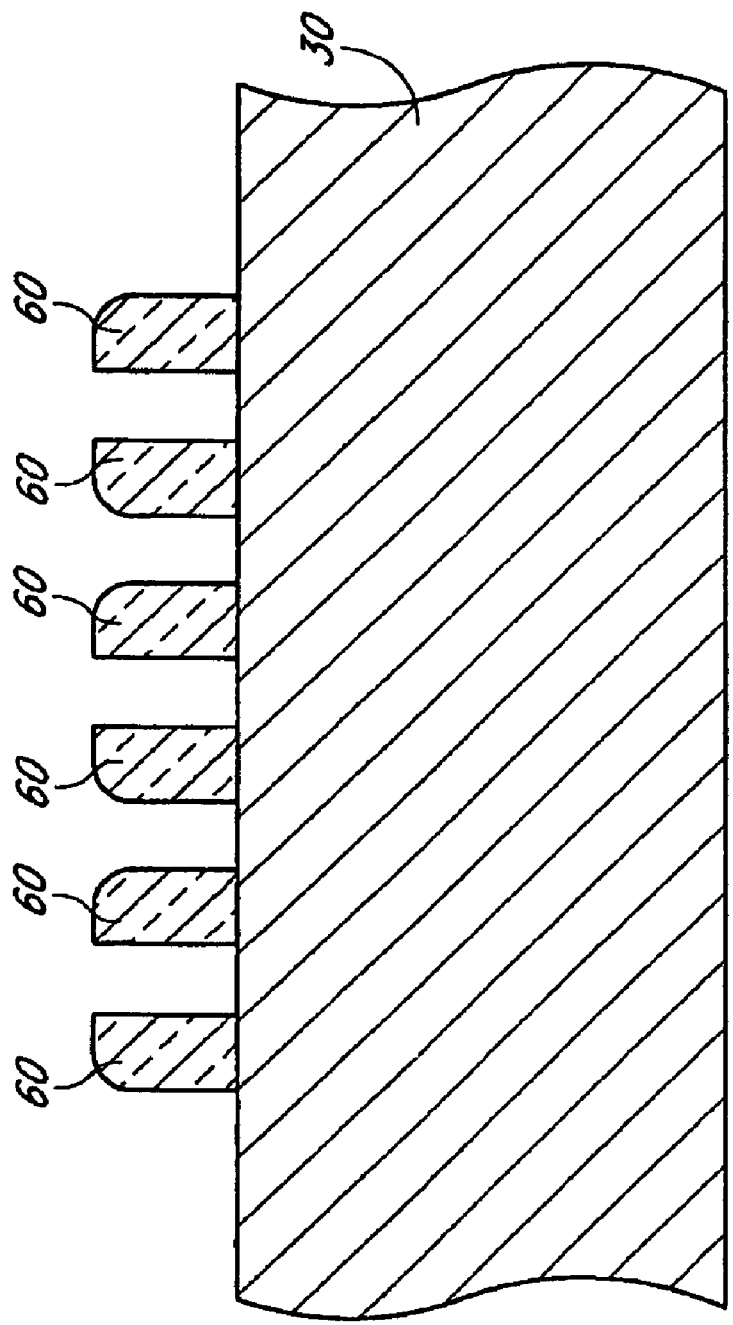

Due to the continual reduction in feature sizes, pitch multiplication is being investigated as a means of reducing the dimensions of features on semiconductor devices. Complicated process flows associated with pitch multiplication (see below) and the processing time required to produce pitch multiplied features make this method expensive to repeat. Thus, there is a need for a methodology that offers the benefit of pitch multiplication (i.e. reduced features sizes) while precluding the drawbacks.

Imprint lithography, combined with pitch multiplication, has the potential for forming device features on semiconductor surfaces while substantially reducing the production cost of semiconductor fabrication. A method of forming templates for use in imprint lithography is described by U.S. patent application Ser. No. 11/155,167 to Sandhu et al., filed Jun. 17, 2005, the entire disclosure of which is incorporated herein by reference. Imprint lithography entails pressing a template comprising a pattern into a transfer layer overlying a substrate, more specifically a semiconductor device. The pattern on the template deforms the transfer layer to form a negative or inverse image of the pattern in the transfer layer. The template is subsequently removed, and an anisotropic etching process conveys the transfer layer pattern to the substrate.

The size of the features on the pattern and the corresponding features on the substrate are similar. Unlike photolithography, where a mask or reticle pattern is reduced substantially (e.g., 4×) in size when transferred to the surface of the semiconductor device, imprint lithography is considered a "1×" pattern transfer process because it provides no demagnification of the pattern on the template that is transferred to the semiconductor device. Hence, there is a one-to-one correspondence between the dimensions of the pattern on the template and the pattern on the semiconductor device. However, despite the advantages of imprint lithography, forming templates comprising high-resolution patterns by conventional photolithography poses an obstacle to the reduction of features sizes.

Pitch multiplication coupled with imprint lithography can overcome this obstacle. By using pitch multiplication and conventional photolithography without pitch multiplication to pattern features on a template, the practical application of imprint lithography in semiconductor fabrication is made possible.

In addition to problems with forming differently-sized features, it has been found that pitch multiplication techniques can encounter difficulty in transferring spacer patterns to a substrate. In common methods of transferring patterns, both the spacers and the underlying substrate are exposed to an etchant, which preferentially etches away the substrate material. The etchant, however, can also wear away the small spacers, albeit at a slower rate, and change the intended pattern dimensions. Thus, over the course of transferring a pattern to an underlying material, the etchant can wear away the spacers before the pattern transfer is complete. These difficulties are exacerbated by the trend towards decreasing feature size, which, for example, increasingly leads to the need to form trenches or spaces which have increasingly higher depth-to-width ratios. Thus, in conjunction with difficulties in producing structures having different feature sizes, pattern transfer limitations make the application of pitch multiplication principles to integrated circuit manufacturing even more difficult. In view of these difficulties, the preferred embodiment disclosed herein allows for improved pattern transfer and for the formation of differently sized features in conjunction with pitch multiplication.

A template including pitch multiplied and non-pitch multiplied features configured for use in imprint lithography is disclosed. The template includes a first pattern formed by pitch multiplication and second pattern formed using lithography (e.g., photolithography) without pitch multiplication. The topography of the first pattern and the second pattern on the template is preferably used to imprint features on a transfer layer overlying a second substrate during integrated circuit fabrication. As described in more detail below, bringing the template in contact with the transfer layer imprints the template pattern in the transfer layer. The pattern in the transfer layer is subsequently transferred to the second substrate through a series of etching steps. The pattern formed in the second substrate is a negative image of the pattern in the template.

In accordance with a preferred embodiment of the invention, a template configured for use in imprint lithography including pitch multiplied and non-pitch multiplied features is formed by defining a first pattern using pitch multiplication and a second pattern using photolithography without pitch multiplication on a suitable substrate (e.g., silicon or quartz), conformally depositing a planar layer over the substrate comprising the first pattern and the second pattern, bonding a plate (e.g., quartz wafer) to the surface of the planar layer opposite the substrate and etching away the substrate, leaving the planar layer in contact with the plate, which define the template.

In a first phase of methods according to the preferred embodiment, a first pattern and a second pattern are defined separately in the array and periphery regions, respectively, and separately or simultaneously transferred to the substrate. This method, shown schematically in FIGS. 2A-2L and described in U.S. patent application Ser. No. 10/934,778 of Tran et al., filed Sep. 2, 2005, the entire disclosure of which is incorporated herein by reference, entails forming a first pattern by pitch multiplication and a second pattern using photolithography without pitch multiplication.

Reference will now be made to the Figures, wherein like numerals refer to like parts throughout. It will be appreciated that these Figures are not necessarily drawn to scale. Furthermore, while the description below specifies particular materials, the skilled artisan will readily appreciate that other combinations of materials can be employed with fewer or greater number of hard mask layers as long as suitable selective etches are available for the transfer steps described.

Figure 2A:
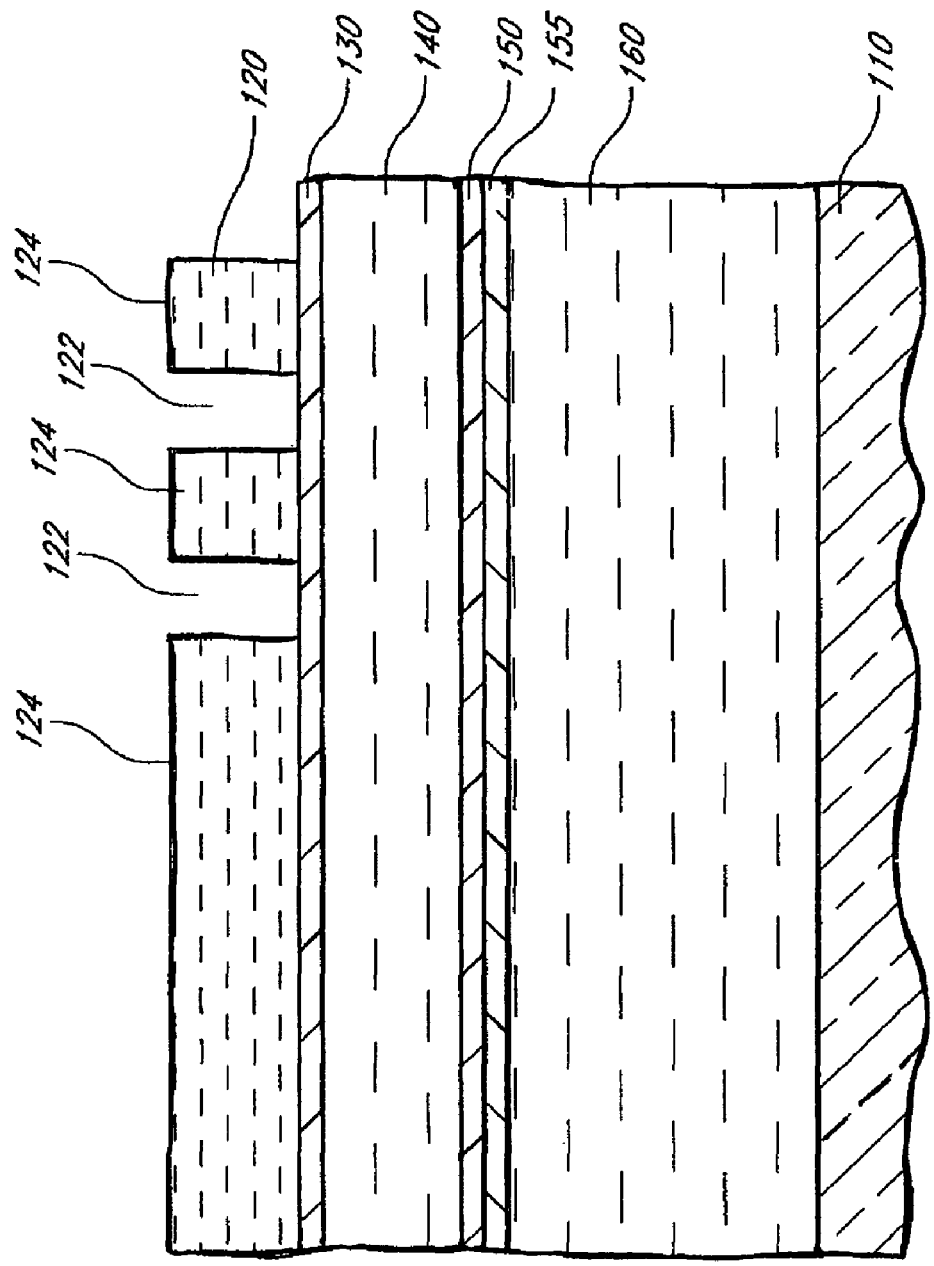

With reference to FIG. 2A, formation of the first, pitch multiplied pattern is accomplished by forming a pattern of trenches or spaces 122 (delimited by photodefinable material features 124) using photolithography in a photodefinable layer 120 overlying a series of layers; from top to bottom: a first hard mask layer 130 comprised of an inorganic material, e.g., a dielectric anti-reflective coating (DARC); a temporary layer 140 formed of amorphous carbon; a second hard mask layer 150 made of silicon; a third hard mask layer 155 formed of a low silane oxide (LSO); a primary mask layer 160 formed of amorphous carbon; and a substrate 110.

Figure 2B:
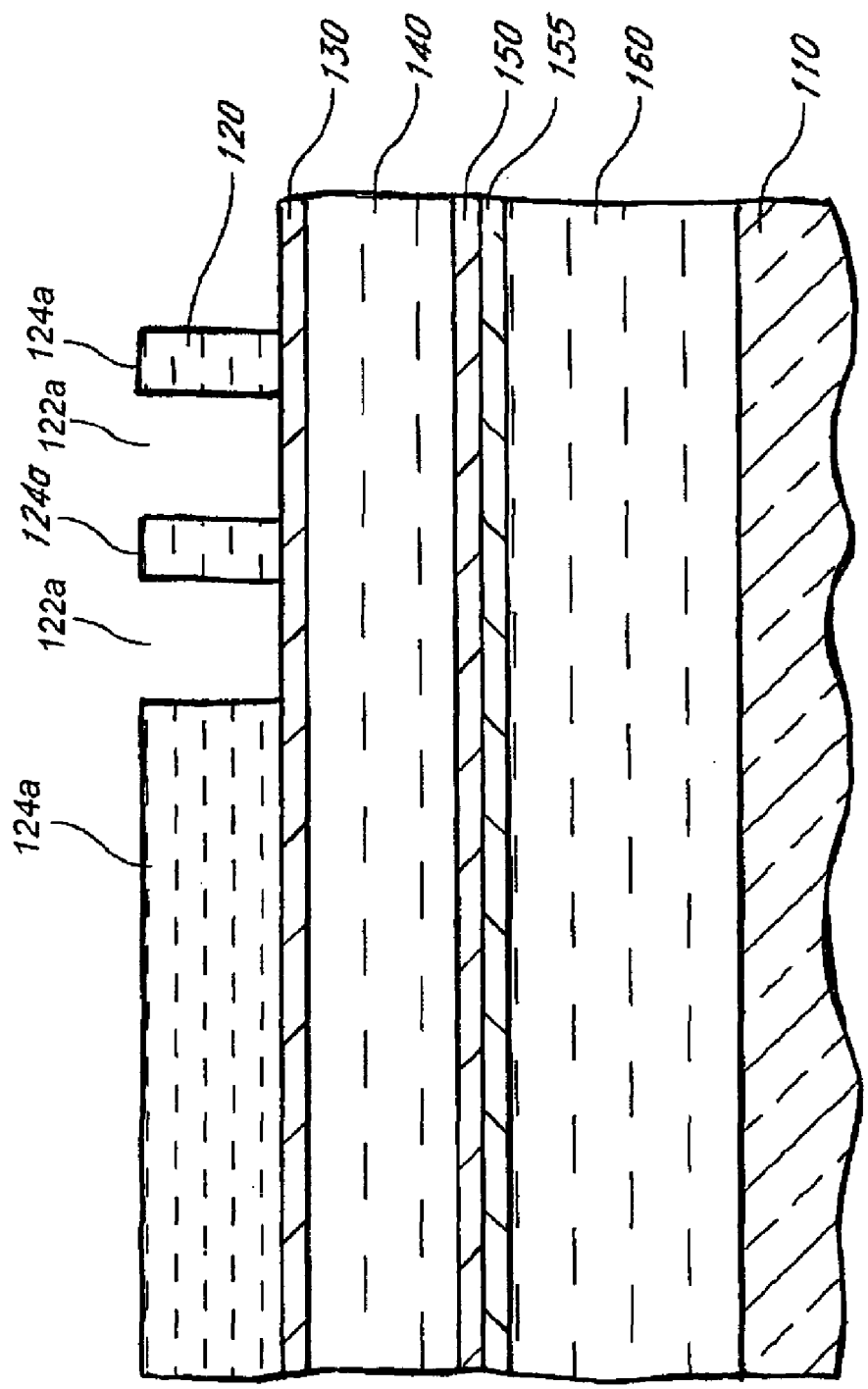
Figure 2C:
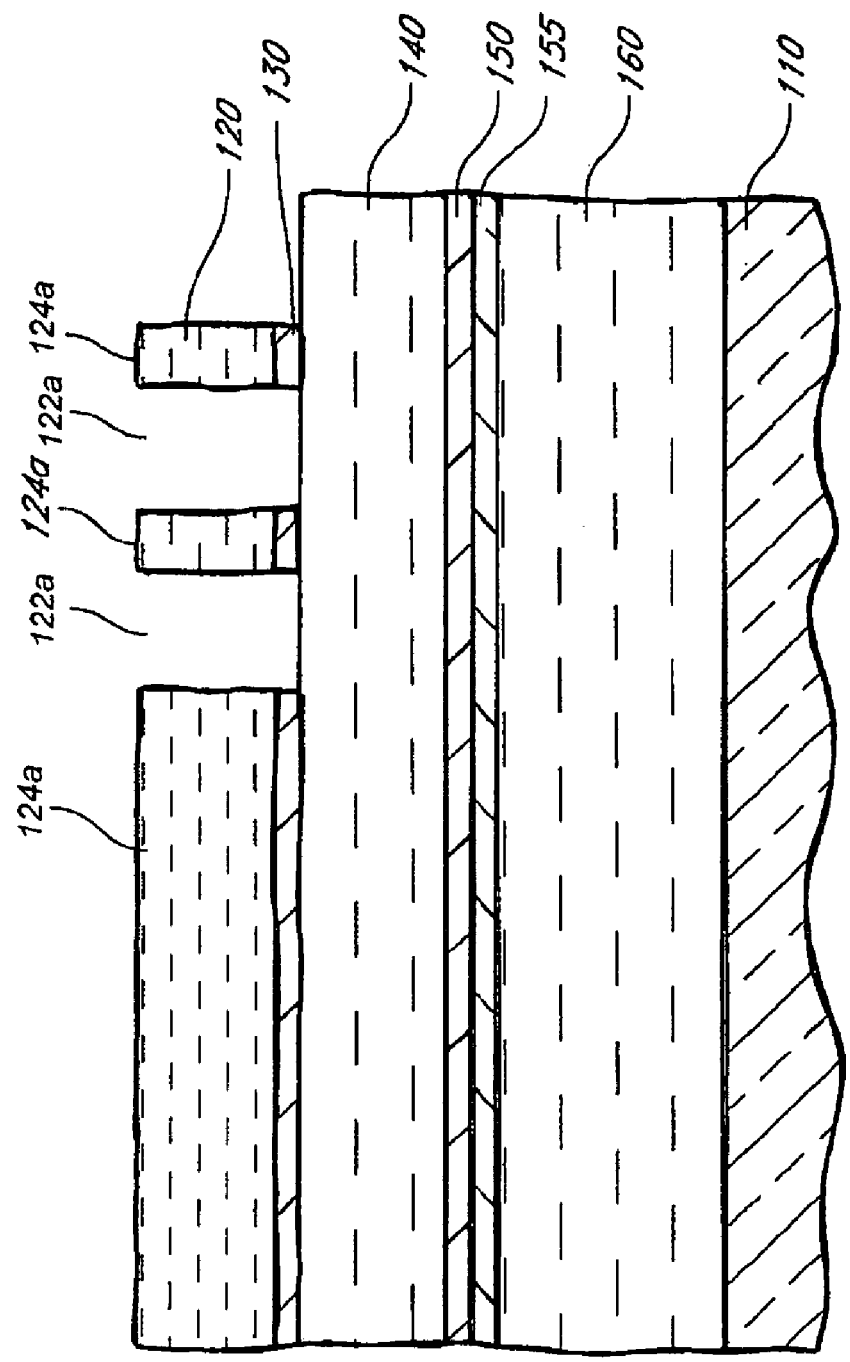
Figure 2D:
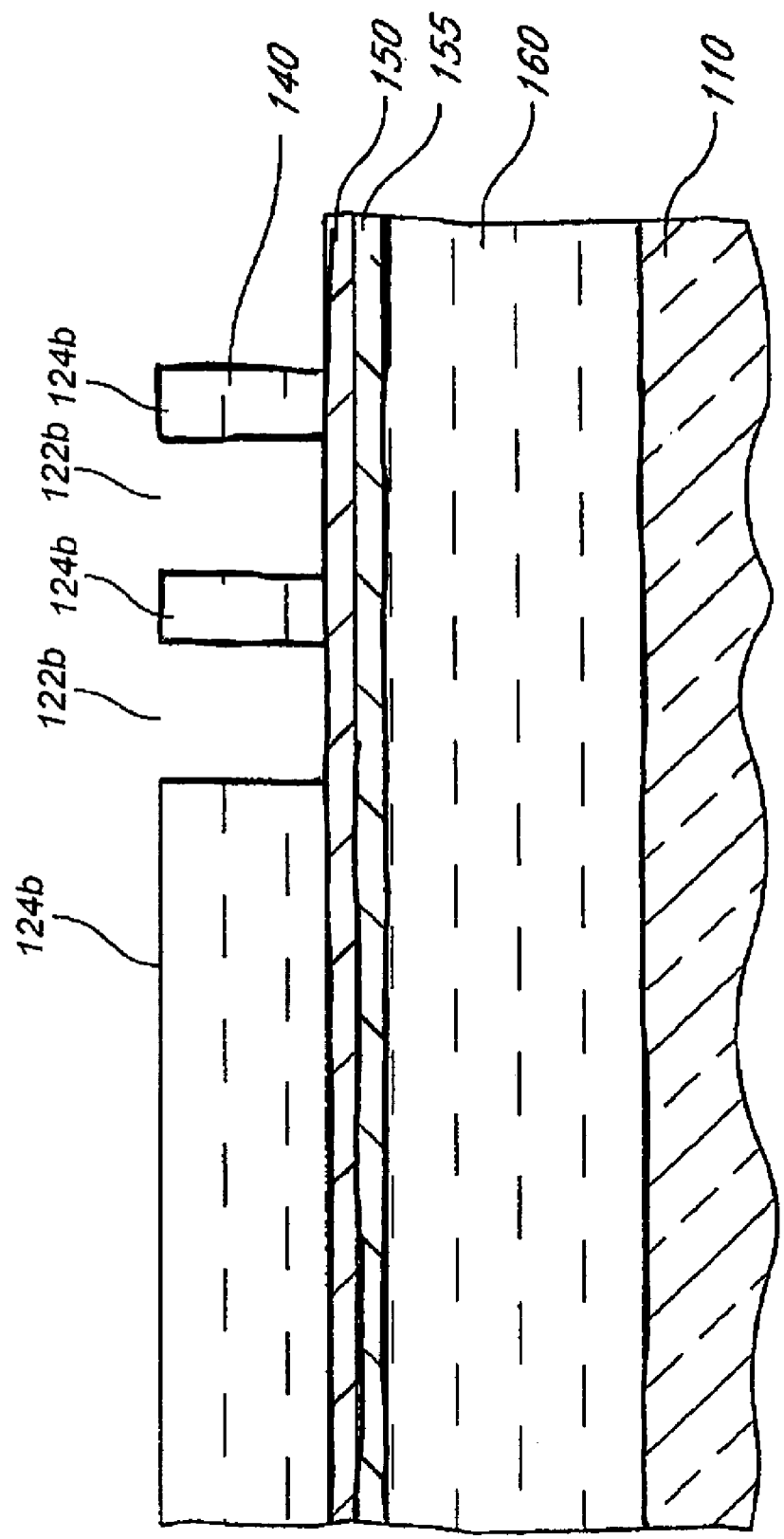

Next, the trenches 122 are preferably widened by isotropically etching ("shrink etch") the photoresist lines 124 to form modified spaces 122a and lines 124a, as shown in FIG. 2B. The pattern in the (modified) photodefinable layer 120 is transferred to the hard mask layer 130, as shown in FIG. 2C. The pattern in the photodefinable layer 120 and the hard mask layer 130 is subsequently transferred to the temporary layer 140 (simultaneously removing the photodefinable layer 120) to define features 124b and spaces 122b in that layer 140, and the hard mask layer 130 is removed, as shown in FIG. 2D. Alternatively, the shrink etch can be conducted after transferring to the temporary layer 140.

Figure 2E:
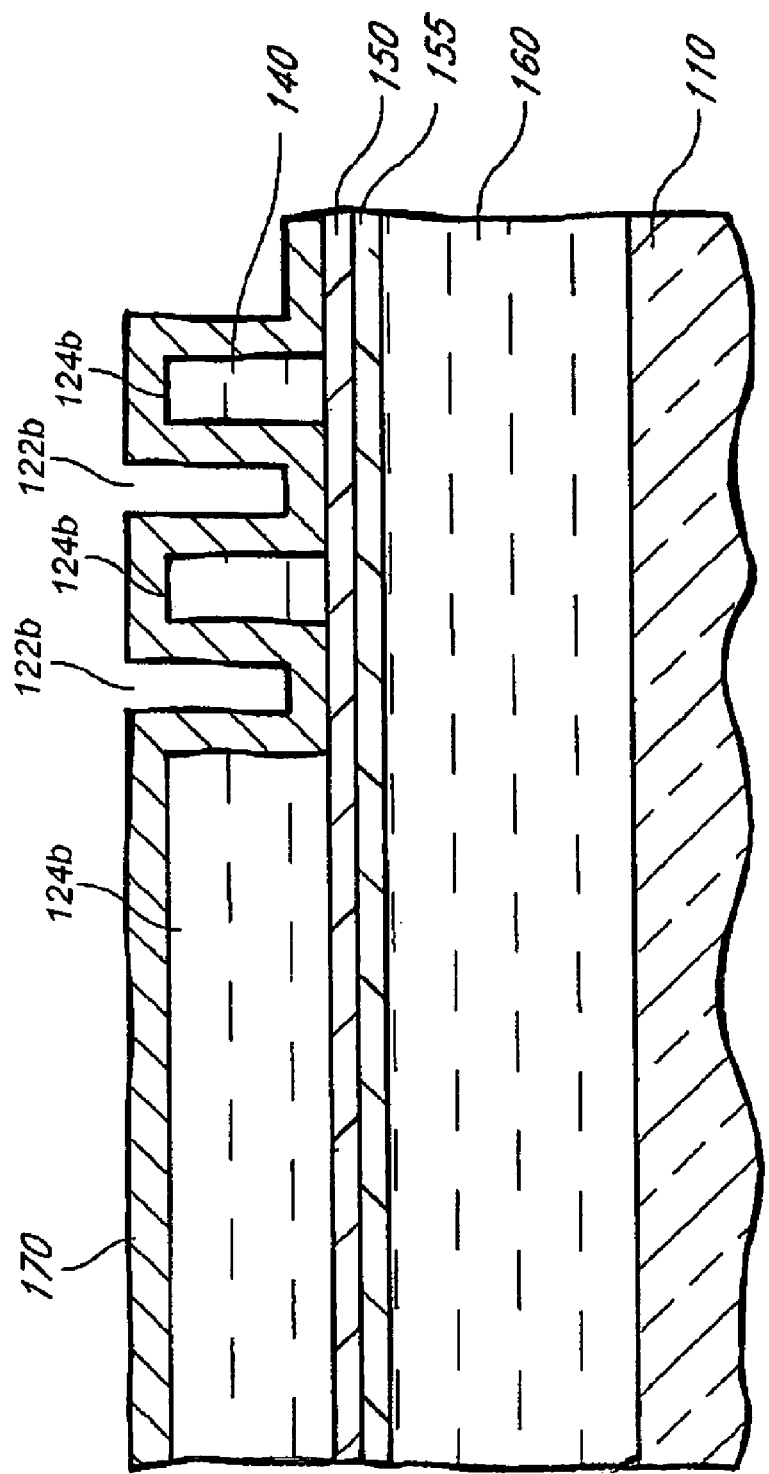
Figure 2F:
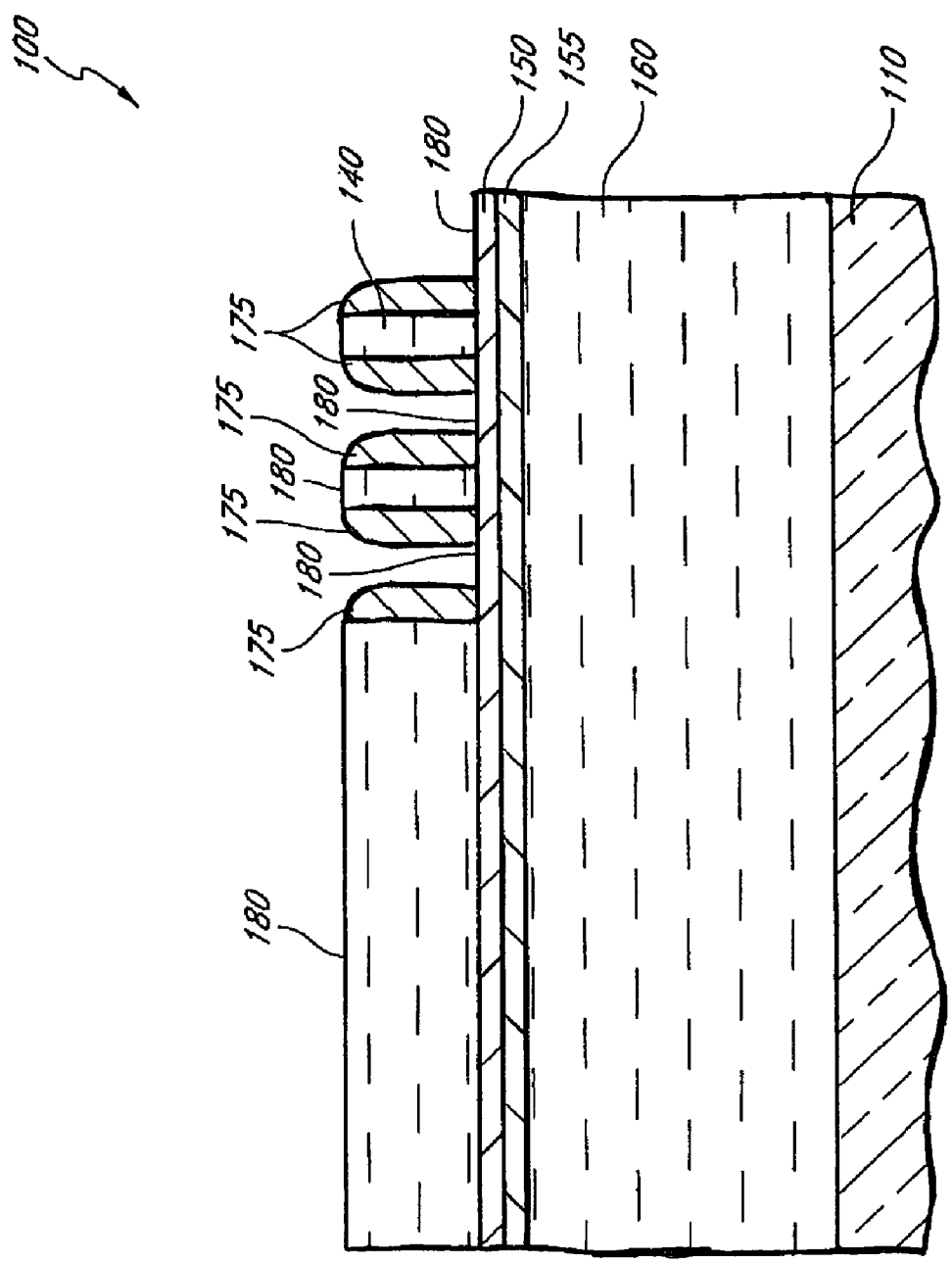
Figure 2G:
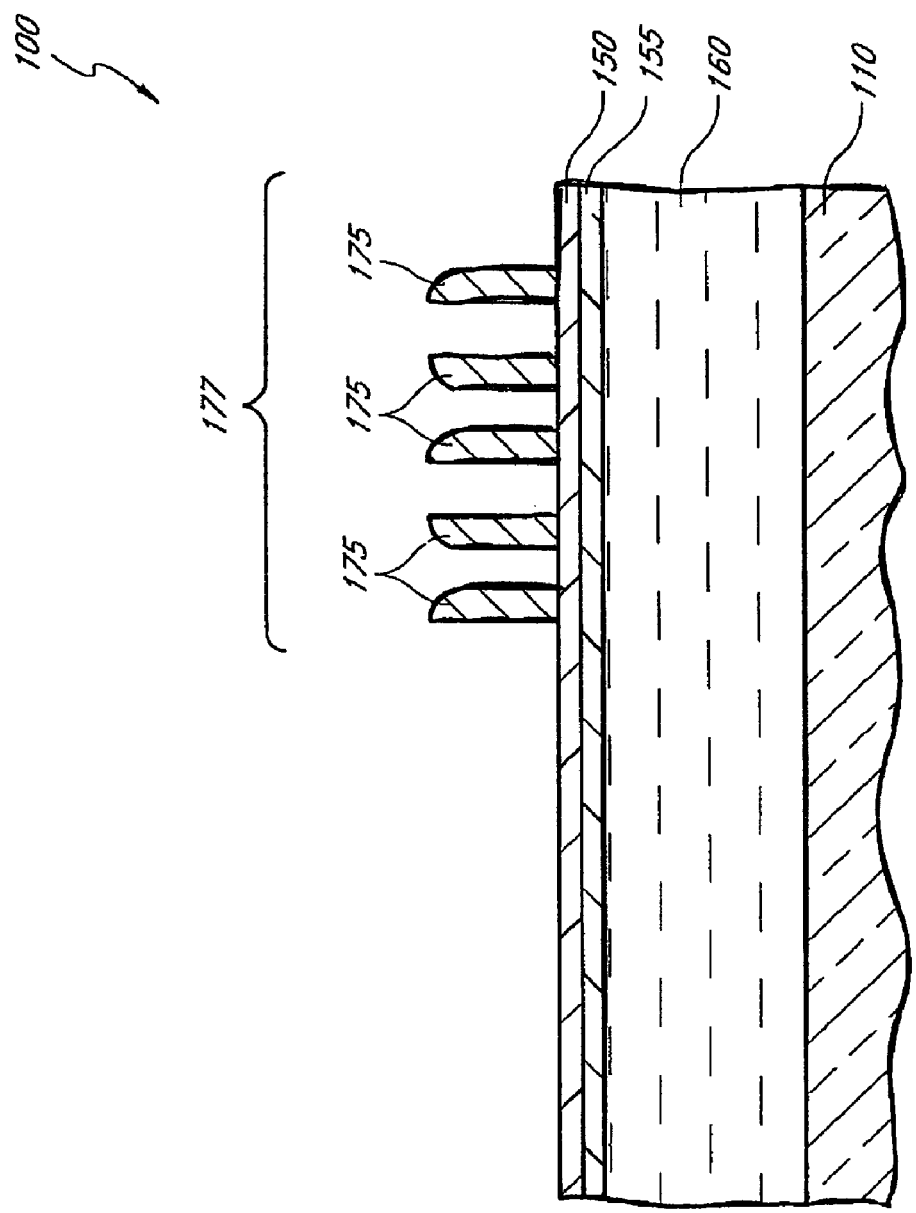

With reference to FIG. 2E, after removal of the hard mask layer 130 a layer 170 of spacer material (e.g., silicon oxide) is blanket deposited conformally over the exposed surfaces. The silicon oxide spacer layer 170 is then subjected to an anisotropic etch to remove spacer material from horizontal surfaces 180, as shown in FIG. 2F, leaving sidewall spacers 175 over vertical surfaces. The temporary layer 140 is subsequently removed, leaving freestanding spacers 175 defining the first pattern 177, as shown in FIG. 2G, in a first or array region 102.

Figure 2H:
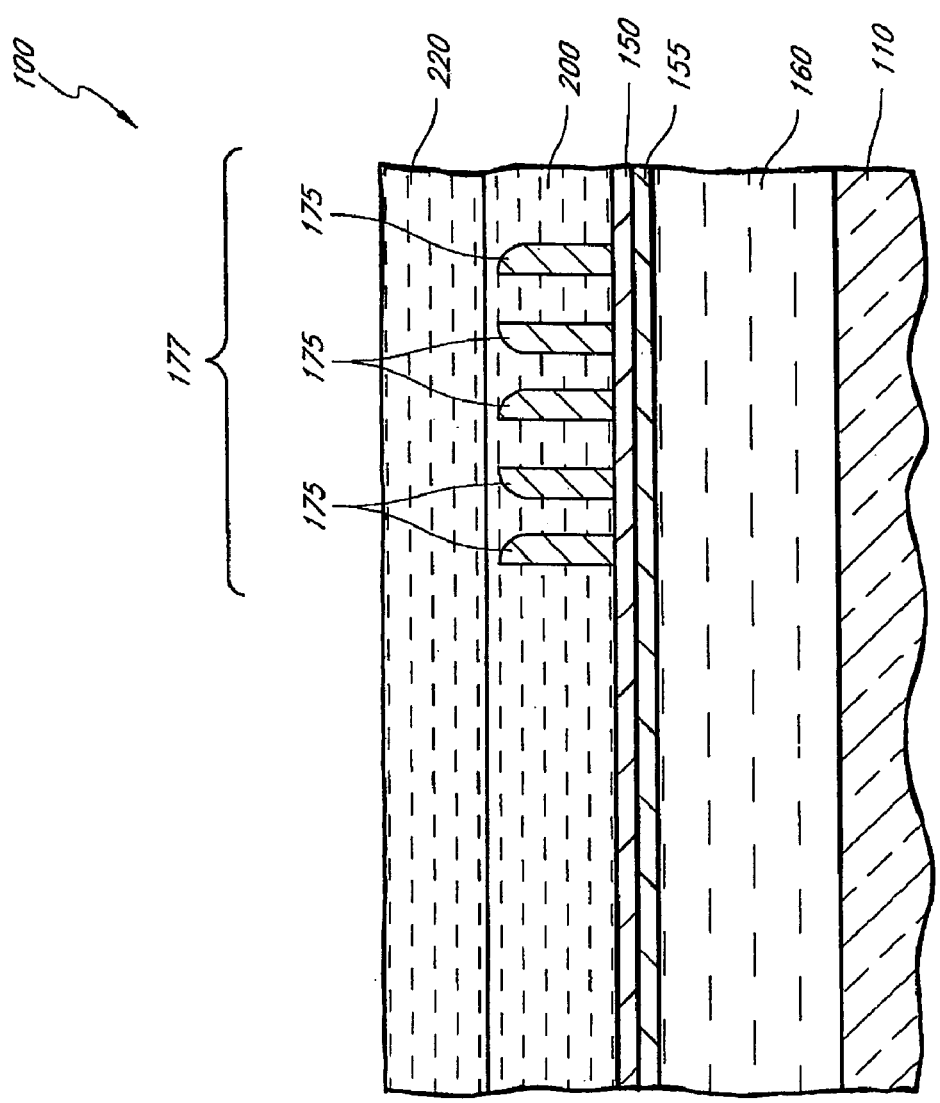
Figure 21:
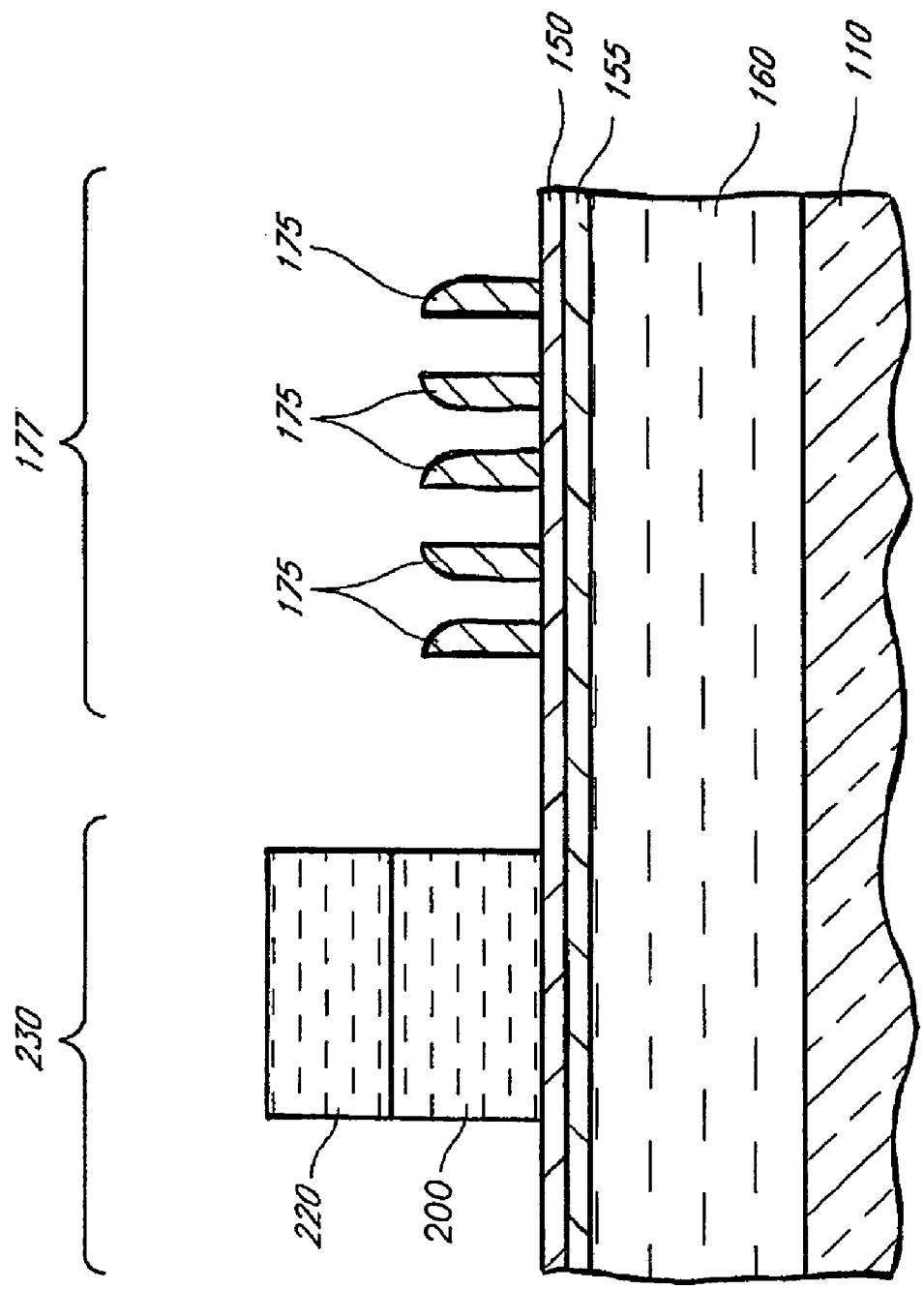

With reference to FIG. 2H, formation of a second, preferably non-pitch multiplied pattern 230 is accomplished by depositing a planarizing material around the spacers 175 to form a planarizing layer 200, and subsequently forming a photodefinable layer 220 on the planarizing layer 200. The second pattern is formed in a second or periphery region 104. Next, the photodefinable layer 220 is patterned photolithographically to form the second pattern 230, which is subsequently transferred to, e.g., the same level as the first pattern 177 of spacers 175, as shown in FIG. 2I. The second pattern 230 may overlap the first pattern 177.

Figure 2J:
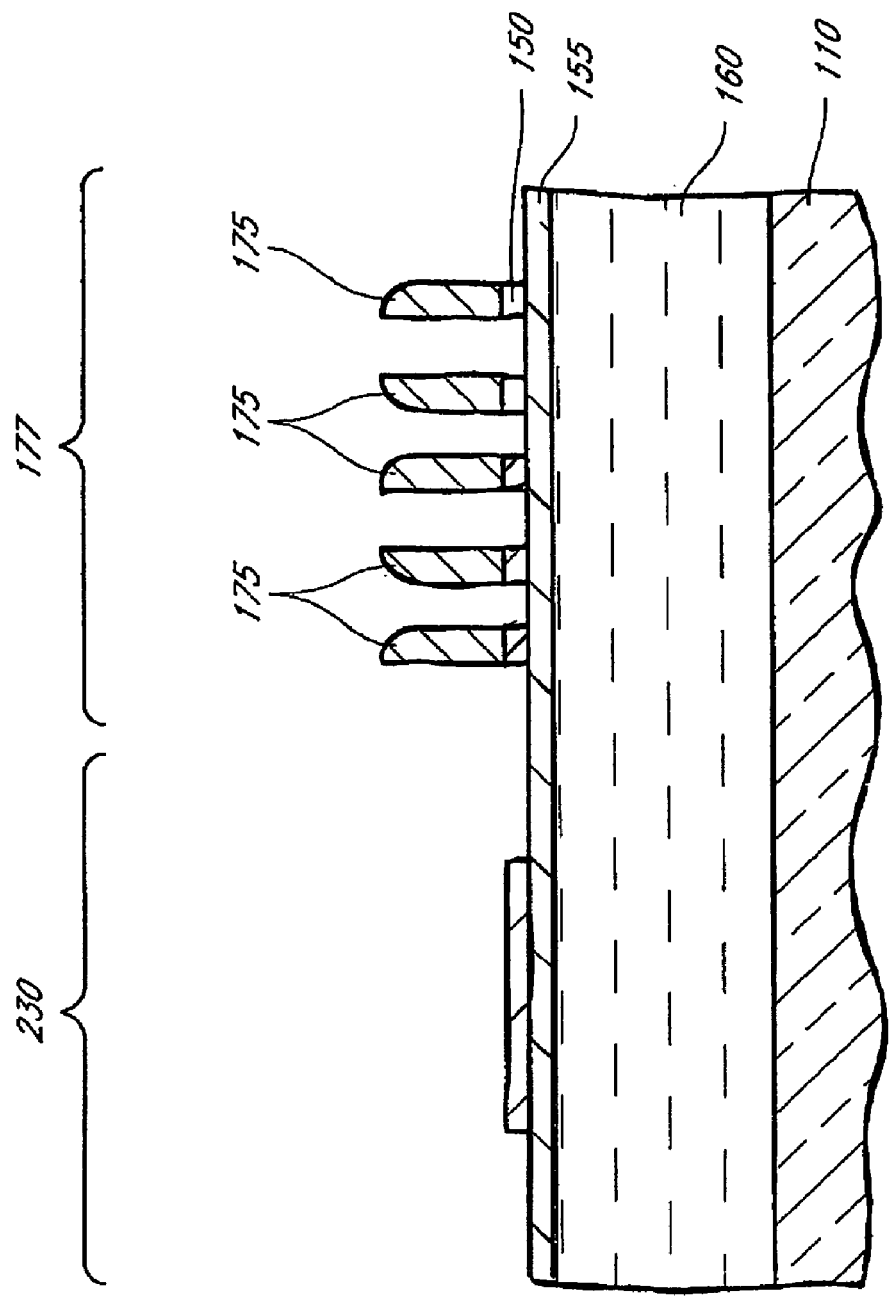
Figure 2K:
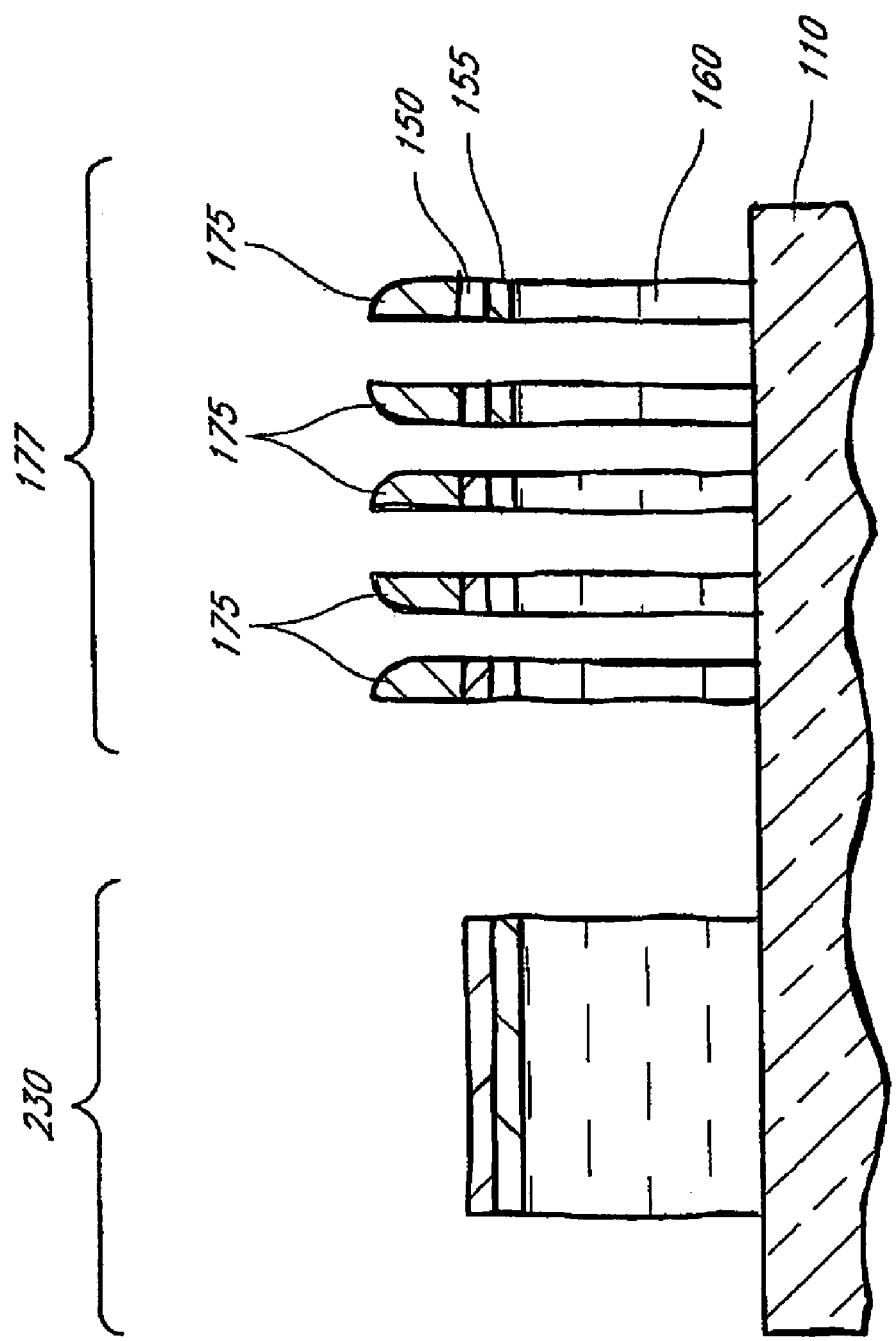

With reference to FIG. 2J, the patterns 177 and 230 are transferred to the second hard mask layer 150 and the first and second patterns 177 and 230 are cleaned by etching away the photodefinable layer 220 and the planarizing layer 200. Next, the patterns 177 and 230 are preferably transferred to the third hard mask layer 155 and subsequently transferred to the primary mask layer 160, as shown in FIG. 2K. Following transfer to the primary mask layer 160, the spacers 175 can be optionally removed and the patterns 177 and 230 are simultaneously transferred to the substrate 110 using the layer 160 as a mask, as shown in FIG. 2L. Alternatively, the patterns 177 and 230 in FIG. 2J can be directly transferred to the substrate 110 without the intermediate transfer to the primary mask layer 160. However, better pattern fidelity has been found by consolidating the patterns 177 and 230 first in a primary mask layer 160, as shown. As a result, separate pitch multiplied and a non-pitch multiplied patterns have been defined on a substrate.

In a second phase of methods according to the preferred embodiment, a substantially planar layer is formed in contact with a substrate including pitch multiplied and non-pitch multiplied features.

Figure 3A:
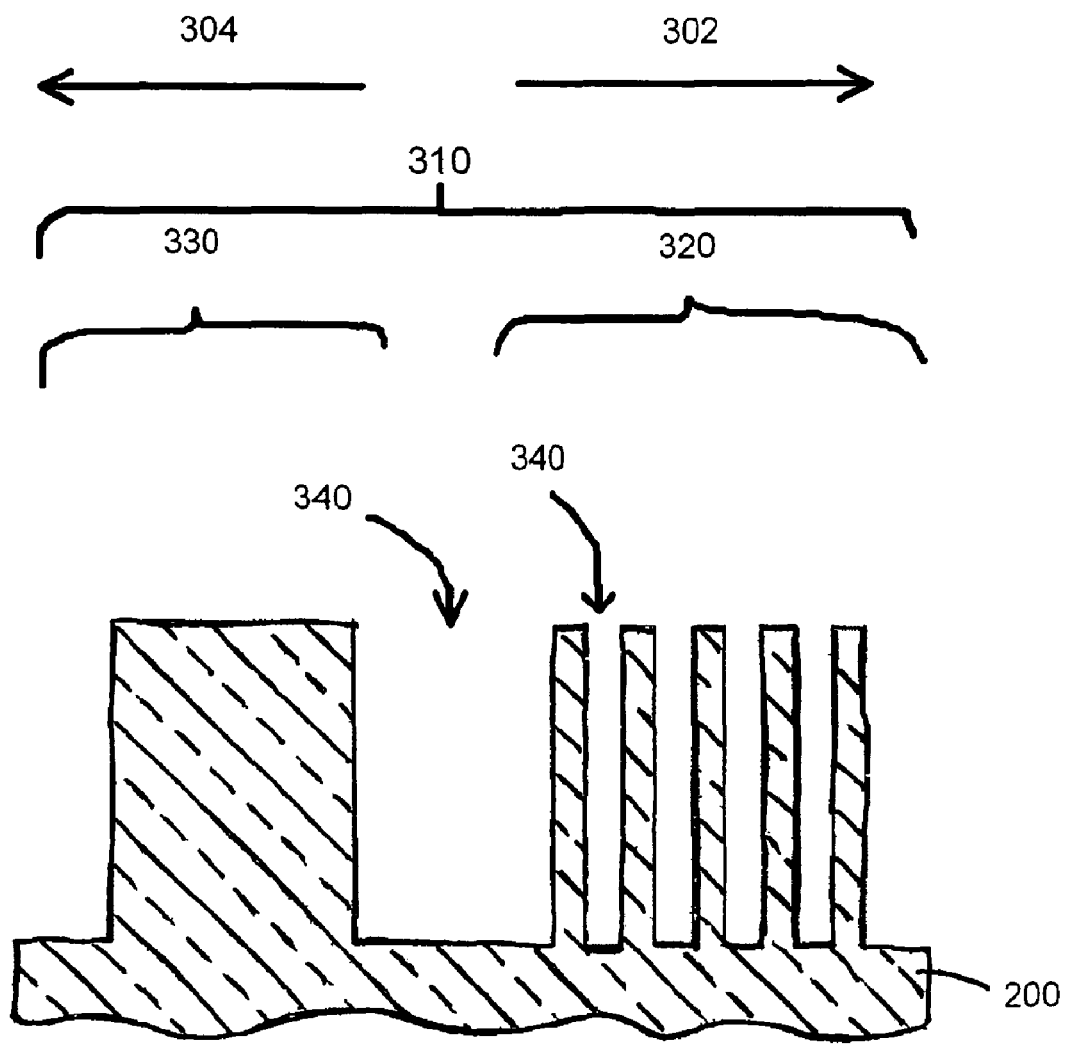
FIGS. 3A and 3B are schematic, cross-sectional side and top plan views of a substrate including pitch multiplied and non-pitch multiplied features, in accordance with a preferred embodiment of the invention.
Figure 3B:
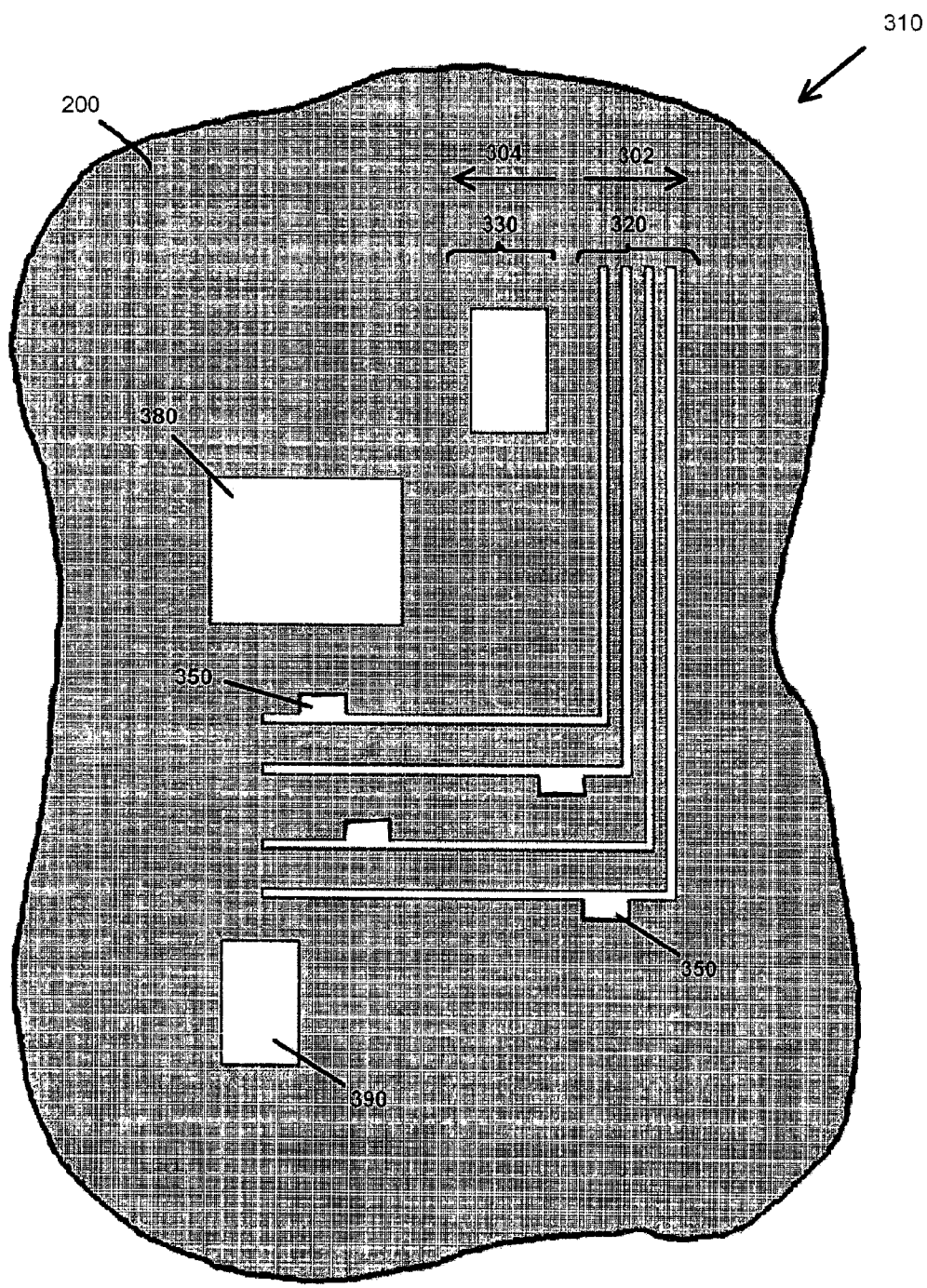

FIGS. 3A and 3B are cross-sectional side and top plan views of a substrate 200 that includes a first pattern 320 formed through pitch multiplication and a second pattern 330 formed without pitch multiplication (i.e. non-pitch multiplied). The pitch multiplied pattern 320 comprises features in a first or array region 302. The non-pitch multiplied pattern 330 comprises features in a second or periphery region 304. Features are separated from one another by trenches or spaces 340. The pitch multiplied pattern 320 and the non-pitch multiplied pattern 330 collectively define a combined pattern 310.

With continued reference to FIGS. 3A and 3B, in the illustrated combined pattern 310, non-pitch multiplied features 330 may overlap the pitch multiplied features 320, as shown by overlapping features 350. Additional non-pitch multiplied features 380 and 390 are formed at the periphery 304 of the integrated circuit array pattern 310 without overlapping the pitch multiplied features 320. Where desired, alignment marks (not shown) may be formed on select portions of the substrate 200 using conventional photolithographic techniques by, e.g., photolithographically defining non-pitch multiplied features.

The methods and templates described herein can be advantageously applied to form features in an integrated circuit, and larger systems (e.g., computers) incorporating the same. For example, the first pattern 320 may define features of a shallow trench isolation (STI) structure or pattern, metal interconnect, control gate stack for a NAND flash memory, logic array, gate array or memory array. The methods are particularly advantageously applied to form devices having dense arrays of electrical devices or lines, including memory cell arrays for volatile and non-volatile memory devices, such as DRAM, ROM or flash memory, including NAND flash memory, or having logic or gate arrays. For example, the logic array can be a field programmable gate array (FPGA) having a core array similar to a memory array and a periphery with supporting logic circuitry. Consequently, the integrated circuit pattern 310 can be a pattern comprising, e.g., a memory chip or a processor, which can include both a logic array and embedded memory, or any other integrated circuit having a logic or a gate array.

The substrate 200 may be a wafer formed of an opaque material, such as silicon, ceramic, or a metal. Preferably a conventional silicon wafer is employed, although in other arrangements (see FIG. 5 and attendant description below), a quartz wafer can be used. The wafer thickness is carefully chosen to enable removal of the wafer following bonding of a transparent layer 410 to a transparent substrate 430 (FIG. 4B), as described below.

Figure 4A:
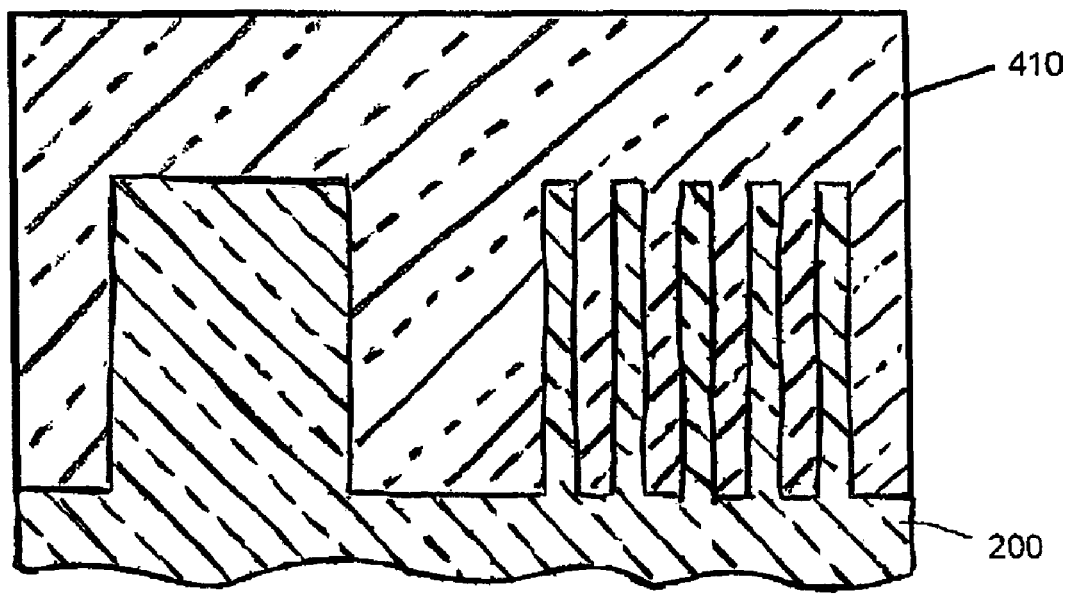
FIG. 4A is a schematic, cross-sectional side view of the substrate in FIGS. 3A and 3B after forming a substantially planar layer in contact with the substrate, in accordance with a preferred embodiment of the invention.

With reference to FIG. 4A, a second material is deposited over the substrate 200, filling in the spaces 340 of the substrate pattern 310 to form a planar layer 410 overlying the substrate 200. The second material is preferably transparent to radiation used at an imprinting stage, discussed below, to cure a transfer layer molded by the template being formed. In the illustrated embodiment, the planar layer 410 is transparent to ultraviolet ("UV") wavelength radiation. In one embodiment, the transparent material is a form of silicon oxide (e.g., quartz). The upper surface of the transparent layer 410 is substantially planar. The transparent layer 410 may be deposited using any suitable deposition technique including, but not limited to, chemical vapor deposition ("CVD"), physical vapor deposition ("PVD"), atomic layer deposition ("ALD"), spin coating, or combinations thereof. The UV transparent layer 410 is deposited to fill in the spaces 340 of substrate pattern 310 without producing voids between the transparent layer 410 and the topography on the substrate 200. If the topography of the substrate 200 includes large spaces, the transparent layer 410 may be formed by filling the spaces with a transparent material using a combination of ALD to conform to the topography of substrate 200 followed by spin coating a similar or different transparent material. The transparent layer 410 is preferably planarized using chemical mechanical polishing (CMP) or a dry etch back process.

Figure 4B:
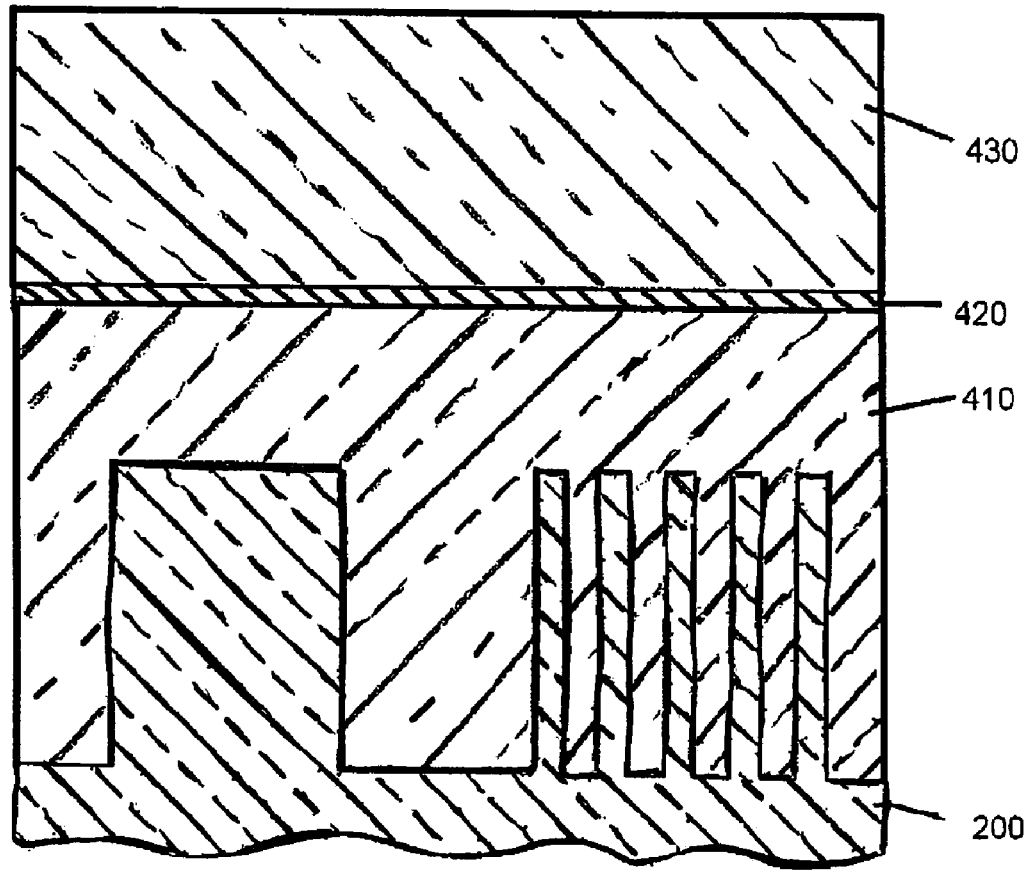
FIG. 4B is a schematic, cross-sectional side view of the substrate and planar layer of FIG. 4B after bonding a plate to the planar layer using an adhesive layer, the planar layer, the adhesive layer and the plate defining a partially-formed template, in accordance with a preferred embodiment of the invention.

In a third phase of methods according to the preferred embodiment, a plate 430 is bonded to the planar surface of the transparent layer 410 through an adhesive layer 420 bonded to the planar layer 410 and the plate 430, as shown in FIG. 4B. The plate 430 enables use of existing processing equipment in imprint lithography. Additionally, the plate 430 provides mechanical support to the transparent layer 410 if the transparent layer 410 is too thin to withstand imprinting pressures. The plate 430 is preferably 0.25 inches (0.64 cm) thick with substantially planar surfaces. The plate 430 is preferably made of transparent material and, more preferably, a UV transparent material with an index of refraction substantially similar to that of the transparent layer 410. A preferred material for the plate 430 is quartz. Since the surface of the transparent layer 410 is substantially planar, good adhesion may be obtained between the transparent layer 410 and the plate 430 using an adhesive layer 420. The composition of the adhesive layer should be chosen to not affect the transparency of the transparent layer 410 or the plate 430. In the preferred embodiment, the adhesive layer 420 has an index of refraction substantially similar to the index of refraction of the transparent layer 410 and the plate 430 and is similarly transparent to UV radiation. Such adhesive compositions may be selected by one of ordinary skill in the art.

Figure 4C:
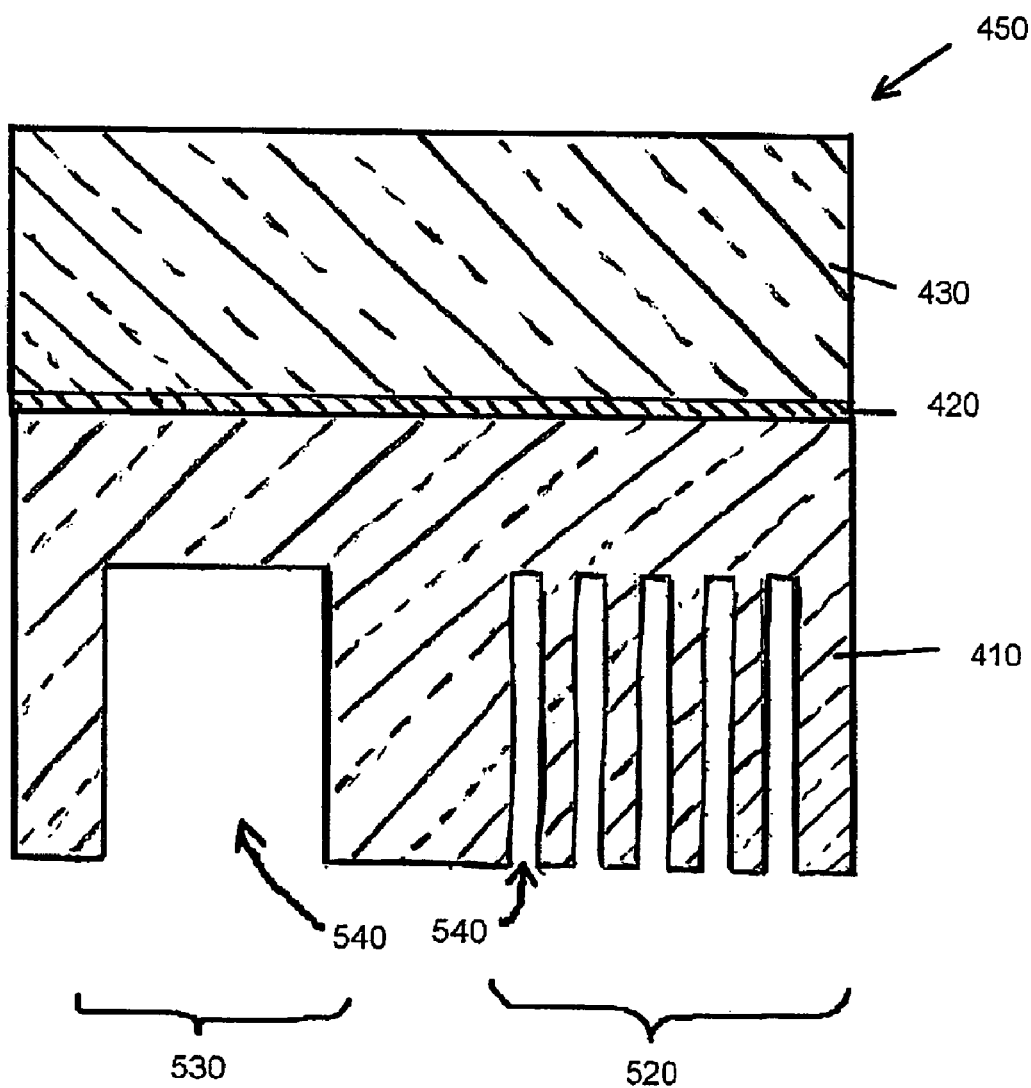
FIGS. 4C and 4D are schematic, cross-sectional side and top plan views of the substrate and partially-formed template of FIG. 4B after etching away the substrate, in accordance with a preferred embodiment of the invention.
Figure 4D:
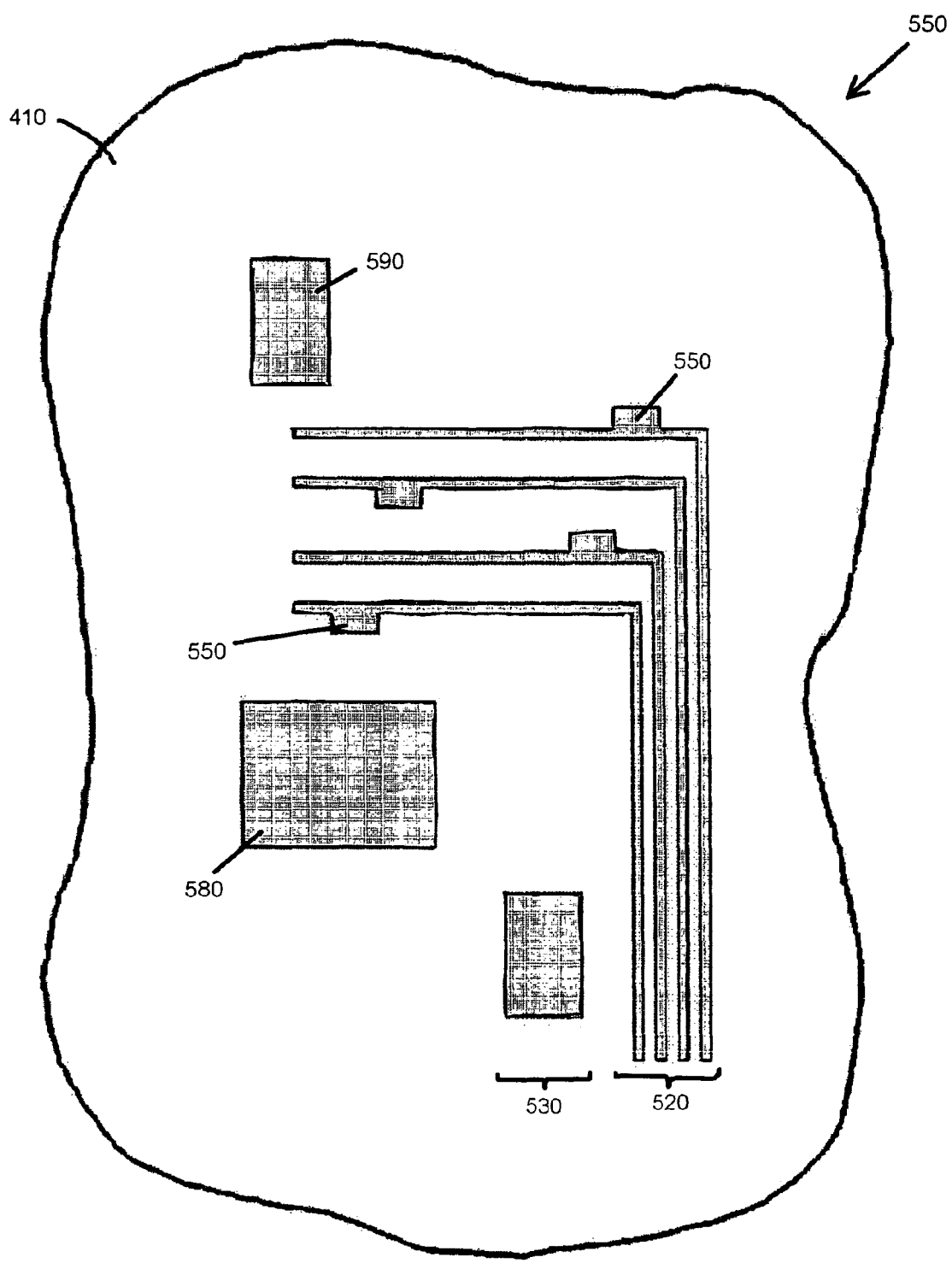

In the fourth phase of methods according to the preferred embodiment, the substrate 200 is removed from the transparent layer 410 to define the template 450, as shown in FIGS. 4C and 4D. The template 450 comprises transparent layer 410 bonded to the plate 430 through the adhesive layer 420. The substrate 200 can be removed using, e.g., conventional wet or dry etch techniques selective for the substrate 200 relative to the transparent layer 410. Consequently, the transparent layer 410 remains substantially undamaged after removing the substrate 200. Where the substrate 200 is an opaque material, e.g., silicon, an etch of the first substrate 200 may be achieved by a rapid and inexpensive conventional wet silicon etch. The template 450 formed following the etching process includes a combined template pattern 550 comprising pitch multiplied 520 and non-pitch multiplied 530 features in the UV transparent layer 410. The transparent layer 410 and the template pattern 550 in the transparent layer 410 collectively define a patterned structure. The template patterns 550 comprise spaces or trenches 540.

With continued reference to FIGS. 4C and 4D, the combined pattern 550 formed in the transparent layer 410 in the fourth phase of the method according to the preferred embodiment is a negative image of the pattern 310 in the substrate 200 (FIG. 3A). Spaces 540 in the transparent layer 410 correspond to pitch multiplied and non-pitch multiplied features 320 and 330, respectively, in the substrate 200, and features 520 and 530 in the transparent layer 410 correspond to spaces 340 in the substrate 200. Further, spaces 580 and 590 in the periphery of the pattern 550 correspond to photolithographically defined features 380 and 390, respectively, in the substrate 200. Thus, the negative images of the patterns overlying the substrate 200 are transferred to the transparent layer 310.

The combined pattern 550 in the template 450 may be collectively termed the "imprint pattern." The imprint pattern 550 includes a plurality pitch multiplied and non-pitch multiplied features (represented by spaces, recesses or trenches in the template 450) of satisfactory size, configuration and orientation on the surface of the transparent layer 410. The non-pitch multiplied features may overlap the pitch multiplied features, and the degree of overlap may vary with application.

Figure 5:
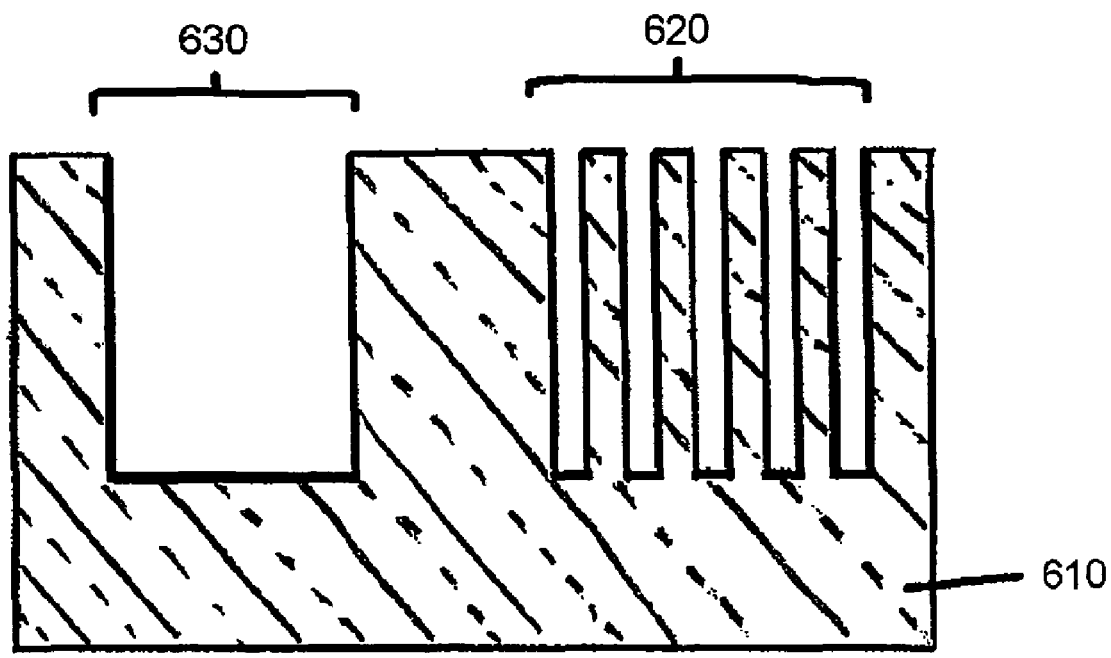
FIG. 5 is schematic, cross-sectional side view of a template including pitch multiplied and non-pitch multiplied features, in accordance with another preferred embodiment of the invention.

With reference to FIG. 5, in an alternative embodiment, a template for use in imprint lithography comprising pitch multiplied and non-pitch multiplied features is formed by applying the process of FIGS. 2A-2L directly to a suitable substrate that will serve as part of the template. For example, the substrate 610 may be a transparent material, such as a quartz wafer. The substrate 610 includes pitch multiplied 620 and non-pitch multiplied 630 patterns formed by separately or simultaneously defining patterns on a series of protective and masking layers per the process of FIGS. 2A-2L. Prior to transferring the patterns down to the substrate 610, however, a negative or inverse mask image is created. For example, the pattern of FIG. 2K is filled in with a deposited layer and the structure is etched back or polished to one of the hard mask layers 150 or 155. The primary masking layer 160 and overlying hard mask(s) are then removed, leaving the filler material as a hard mask in the inverse image of FIG. 2K, prior to transferring the pattern to the underlying substrate 610. Alternatively, the masking process of FIGS. 2A-2K can be altered to create the inverse of the image ultimately desired.

With continued reference to FIG. 5, the substrate 610, including pitch multiplied 620 and non-pitch multiplied 630 patterns, will serve as the template. The substrate 610 and the pitch multiplied 620 and non-pitch multiplied patterns 630 collectively define a patterned structure. If desirable, a plate (not shown) may be bonded to the substrate 610 through an adhesive layer to provide mechanical support and enable use of the template with existing imprint lithography equipment. The combination of the plate bonded to the substrate 610 defines the template. The plate is preferably about 0.25 inches (0.64 cm) thick.

It will be appreciated that the material configured to produce the template can include material transparent to resist curing (e.g., UV) radiation, selected from the group including quartz, magnesium fluoride, titanium oxide, calcium fluoride, silicon oxide, silicon dioxide, polycarbonate, Pyrex® material, sapphire, silicon germanium carbon, gallium nitride, germanium, gallium arsenide, gate oxide, and mixtures and combinations thereof. In the preferred embodiment, the substrate material is a form of silicon oxide in the form of a quartz wafer.

In another embodiment, a template, such as that produced by the process of FIGS. 2-4 or FIG. 5, is utilized to produce pitch multiplied and non-pitch multiplied features on a semiconductor device by imprint lithography. The methodology entails imprinting a desired pattern in a transfer layer overlying a substrate and transferring the pattern in the transfer layer to the substrate, optionally through a series of protective layers using conventional semiconductor fabrication processes.

Figure 6B:
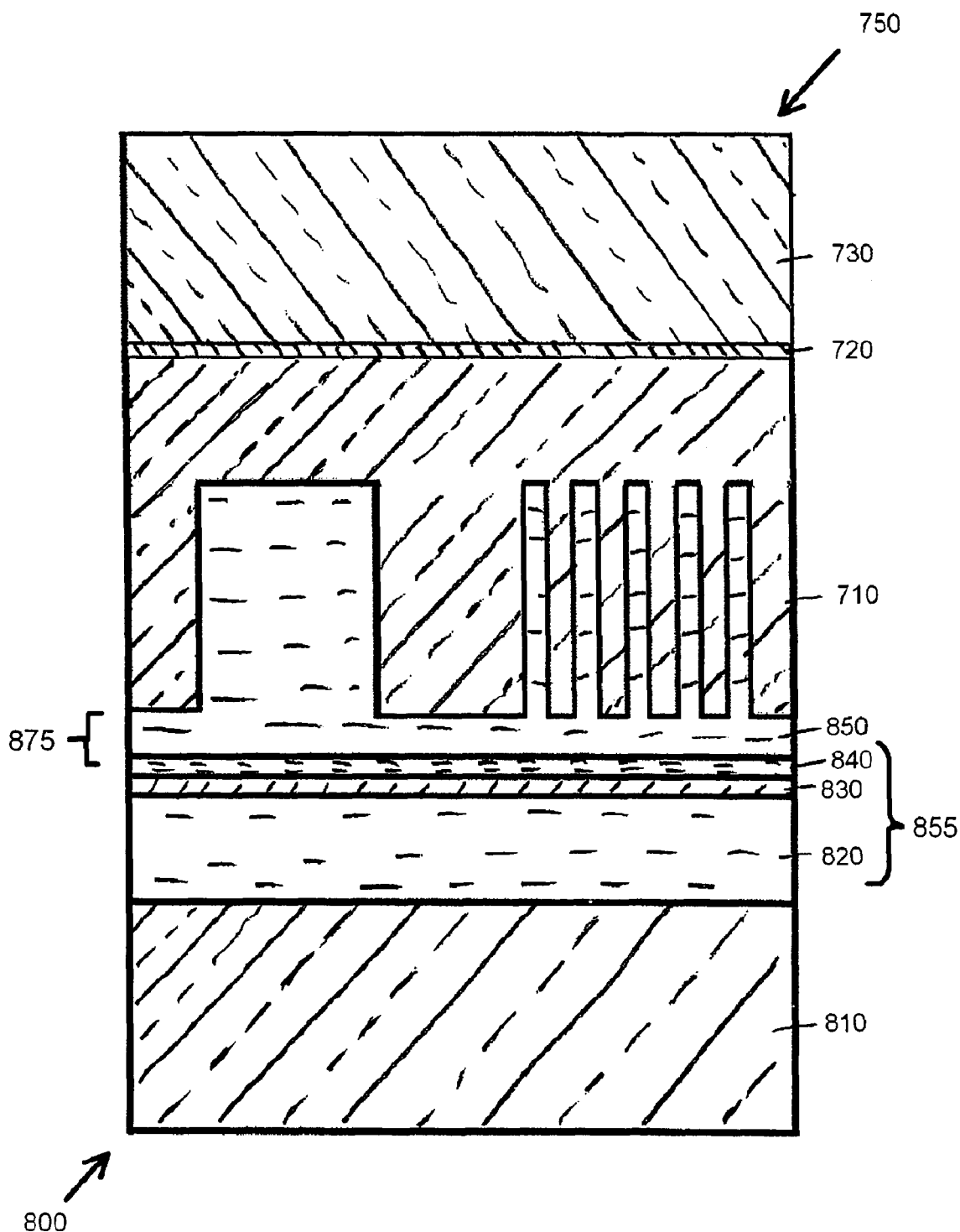

With reference to FIGS. 6A and 6B, features on the substrate 810 are formed by bringing the template 750 into contact with a semiconductor device 800 including a transfer layer 850 overlying a series of mask layers 855, which further overlie a semiconductor substrate 810. In the illustrated embodiment, the transfer layer 850 overlies a protective layer 840 made of an anti-reflecting coating (ARC), e.g., bottom anti-reflective coating (BARC), which overlies a hard mask layer 830, which overlies a primary mask layer 820, which overlies the substrate 810 to be processed (e.g. etched) through a mask. The BARC layer 840 is used to control light reflections if and when UV radiation is used to harden the transfer layer 850. For the sake of example only, the semiconductor substrate is silicon, in the form of a silicon wafer. The transfer layer is preferably deformable under pressure and does not adhere well to the surface of the template 750, especially as the template 750 is removed from the substrate 810. Since the transfer layer 850 is deformable, the transfer layer 850 will fill the spaces 780 of the pitch multiplied 760 and non-pitch multiplied 770 patterns on the template 750 when the template 750 and the semiconductor device 800 come into contact. The transfer layer 850 is preferably a photocurable or photosensitive material, such as a photoresist material. The transfer layer 850 may be formed from conventional photoresist material that is curable by exposure to UV light, such as a curable organosilicon material. Alternatively, the mask layers 855 may include fewer layers than those in the illustrated embodiment. However, better pattern and transfer fidelity has been achieved by transferring the patterns 860 and 870 (FIG. 6C) by way of the illustrated mask layers 855.

The transfer layer 850 overlying the substrate 810 may be applied to designated regions of the semiconductor device 800 using technology that is available to those skilled in the art. The layers discussed herein can be formed by various methods. For example, spin-on-coating processes can be used to form the transfer layer 850. Various vapor deposition processes, preferably a chemical vapor deposition (CVD) process, can be used to form the protective layer 840, the hard mask layer 830 and the primary mask layer 820.

A preferred material for the primary mask layer 820 is amorphous carbon. In the preferred embodiment, the primary mask layer 820 comprises a material having good etch selectivity relative to the substrate 810, and vice versa, to allow for an effective transfer and later mask removal. The hard mask layer 830 is preferably preferentially etchable relative to the primary mask layer 820. The hard mask layer 830 is preferably formed of a material that can be deposited at low temperatures, preferably performed at less than about 550° C. and, more preferably, at less than about 450° C. and, most preferably, at less than about 400° C. The hard mask layer 830 is preferably formed of an inorganic material, with examples including silicon oxide ($SiO_2$), a dielectric anti-reflective coating (DARC) (e.g., a silicon oxynitride), a silicon oxide or silicon. The protective layer 840 is preferably formed of an anti-reflecting coating (ARC), e.g., organic bottom anti-reflective coating (BARC).

As noted above, in common methods of transferring patterns, the mask and the underlying substrate are exposed to etchant, which can wear away a mask before the pattern transfer is complete. These difficulties are exacerbated where the substrate comprises multiple different materials to be etched. It is due to its excellent etch selectivity relative to a variety of materials, including oxides, nitrides and silicon, that the primary mask layer 820 is preferably formed of amorphous carbon and, more preferably, transparent carbon.

Figure 6C:
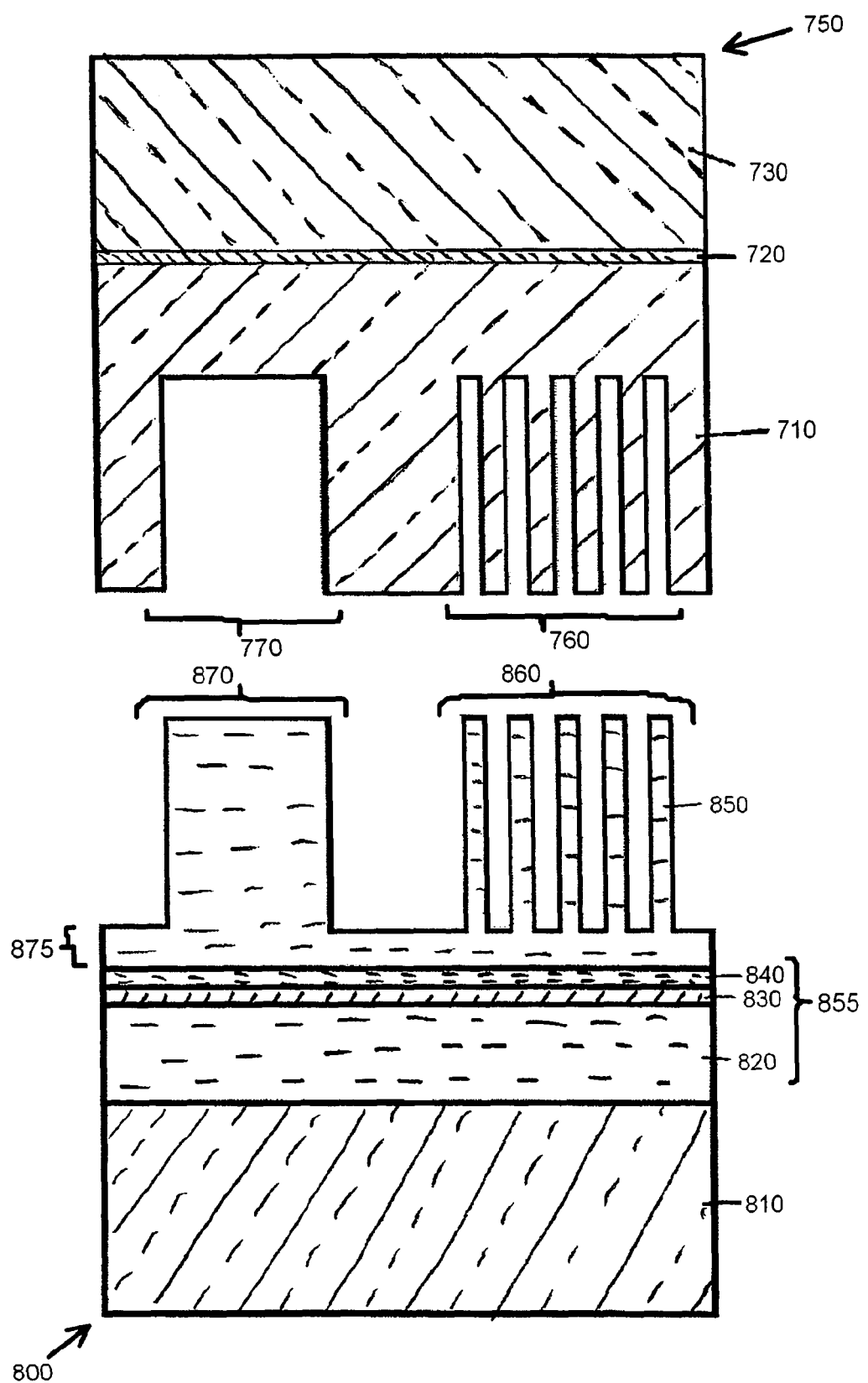
FIG. 6C is a schematic, cross-sectional side view of the partially formed integrated circuit of FIG. 6B after removing the template, in accordance with a preferred embodiment of the invention.

With continued reference to FIGS. 6A and 6B, the semiconductor device 800 and the template 750 may be maintained substantially parallel, and in close proximity, to one another. The semiconductor device 800 and the template 750 may be contacted with minimal pressure so that the transfer layer 850 deforms into the imprint pattern 760 and 770 of the template 750. If the transfer layer 850 is made of UV sensitive material, UV radiation is provided through the template 750 to cure the transfer layer 850. Exposure to UV radiation hardens the transfer layer 850, forming an imprinted pattern including pitch multiplied 860 and non-pitch multiplied 870 patterns in the transfer layer 850, as shown in FIG. 6C. Alternatively, the transfer layer 850 may be cured through the application of heat or infrared radiation. The imprinted patterns 860 and 870 are negative images of the patterns 760 and 770 in the template 750.

With continued reference to FIG. 6C, the template 750 may be removed from the semiconductor device 800 after the transfer layer 850 has been hardened through the application of, e.g., UV radiation. The template 750 may be separated from the semiconductor device 800 without damaging, or otherwise adversely affecting, the imprinted patterns 860 and 870. The template 750 may be treated with a material that lowers the surface energy of the template 750, as known in the art, to assist in separating the template 750 from the semiconductor device 800 without damaging the imprinted patterns 860 and 870. Depending on the height of the features comprising the patterns 760 and 770 in the template 750 relative to the thickness of the transfer layer 850, removal of the template 750 from the transfer layer 850 will tend to leave residual (or unpatterned) portions 875 of the transfer layer 850.

In the next phase of methods according to the preferred embodiment, the imprinted patterns 860 and 870 in the transfer layer 850 is transferred from the transfer layer 850 to the substrate 810 to define pitch multiplied and non-pitch multiplied features in the semiconductor device 800, as shown in FIGS. 7A-7D.

It will be appreciated that the "substrate" to which patterns 860 and 870 are transferred can include a layer of a single material, a plurality of layers of different materials, a layer or layers having regions of different materials or structures in them, etc. These materials can include semiconductors, insulators, conductors, or combinations thereof. For example, the substrate can comprise doped polysilicon, an electrical device active area, a silicide, or a metal layer, such as a tungsten, aluminum or copper layer, or combinations thereof. In some embodiments, the mask features can directly correspond to the desired placement of conductive features, such as interconnects, in the substrate 810. In other embodiments, the substrate 810 can be an insulator and the location of mask features can correspond to the desired location of insulators, such as in etching trenches of spaces in an insulator for damascene metallization. Examples of structures formed in the substrate include gate stacks and shallow trench isolation structures.

It will be understood that in common methods of transferring patterns, both the mask and the underlying substrate are exposed to an etchant, which preferentially etches away the substrate material. The etchants, however, also wear away the masking materials, albeit at a slower rate. Thus, over the course of transferring pattern, the mask can be worn away by the etchant before the pattern transfer is complete. In such cases, the primary masking layer 820 is desirable to prevent the mask pattern from being worn away before the pattern transfer complete.

Preferably, the primary masking layer 820 is the masking layer that directly overlies and, due to etch selectivity, is primarily used as the mask to pattern the substrate 810. In particular, the primary masking layer 820 is preferably formed of a material that allows good etch selectivity relative to both the immediately overlying hard mask layer 830 and the substrate material 810, thereby allowing: the imprinted patterns 860 and 870 to be effectively transferred to it; the primary masking layer 820 to be selectively removed without harming the substrate; and the imprinted patterns 860 and 870 to be effectively transferred to the substrate 810. It will be appreciated that a material is considered selectively, or preferentially, etched when the etch rate for that material is at least about 2-3 times greater, preferably at least about 10 times greater, more preferably at least about 20 times greater and, most preferably, at least about 40 times greater than that for surrounding materials.

In addition to selecting appropriate materials for the various layers, the thicknesses of the layers 820-850 are preferably chosen depending upon compatibility with the etch chemistries and process conditions described herein. For example, when transferring a pattern from an overlying layer to an underlying layer by selectively etching the underlying layer, materials from both layers are removed to some degree. Thus, the overlying layer is preferably thick enough so that it is not worn away over the course of the etch of the underlying layer. The selected thickness, of course, depends in part on the level of selectivity of the etch chemistry.

In any of the steps described herein, transferring the imprinted patterns 860 and 870 from an overlying level to an underlying level involves forming features in the underlying level that generally correspond to features in the overlying level. For example, the path of lines in the underlying level will generally follow the path of lines in the overlying level and the location of other features in the underlying level will correspond to the location of similar features in the overlying level. The precise shapes and sizes of features can vary from the overlying level to the underlying level, however. For example, depending upon etch chemistries and conditions, the sizes of and relative spacings between the features forming the transferred pattern can be enlarged or diminished relative to the pattern on the overlying level, while still resembling the same initial "pattern." Thus, even with some changes in the dimensions of the features, the transferred pattern is still considered to be the same pattern as the initial pattern.

In the illustrated embodiment, the transfer layer 850 is formed of a UV curable photoresist material, the protective layer 840 is formed of bottom anti-reflective coating (BARC), the hard mask layer 830 is formed of dielectric anti-reflective coating (DARC), the primary mask layer 820 is formed of amorphous carbon and the substrate 810 is formed of silicon, preferably in the form of a silicon wafer.

Figure 7A:
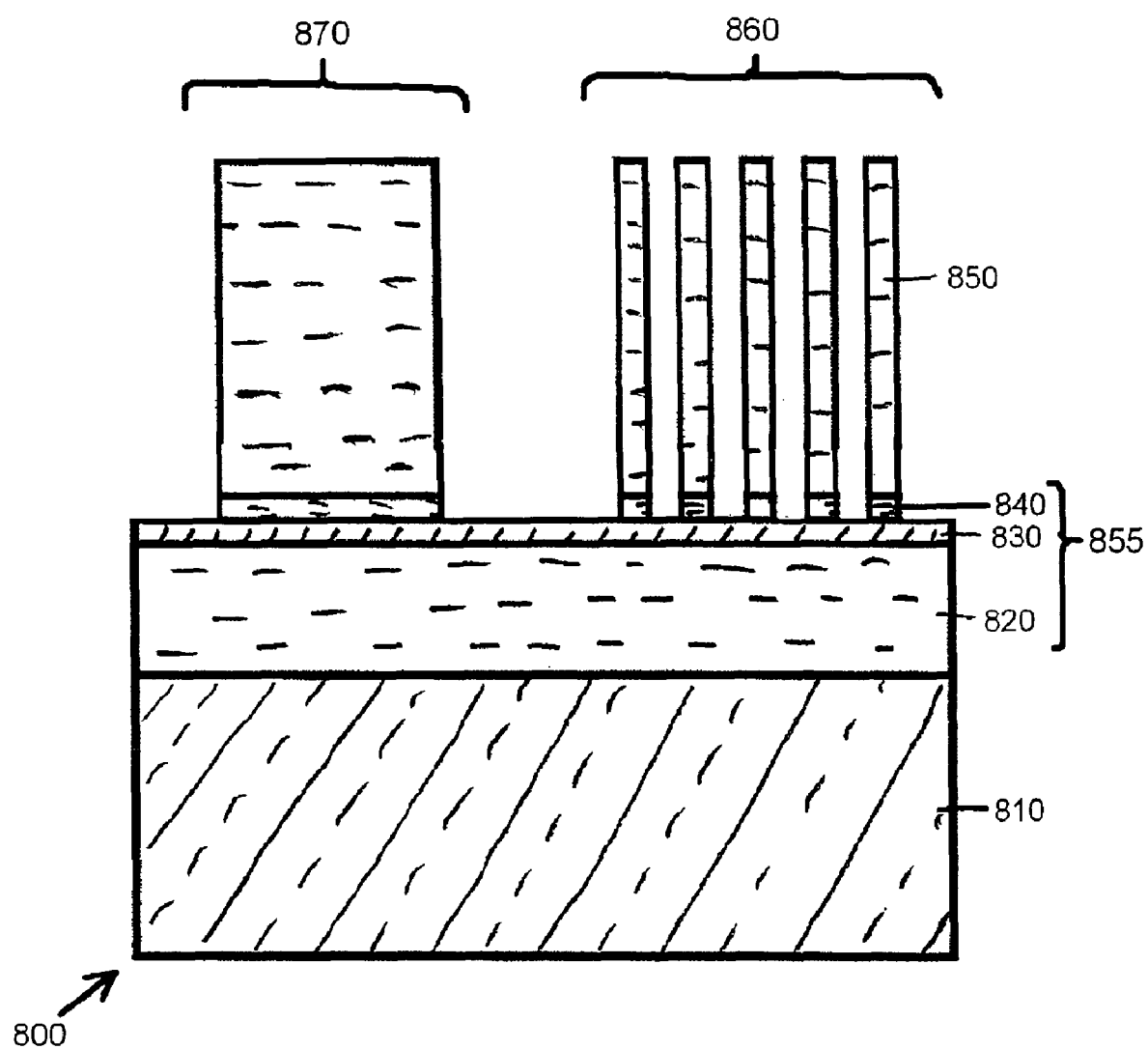
FIG. 7A is a schematic, cross-sectional side view of the partially formed integrated circuit of FIG. 6C after transferring the imprinted pattern from the transfer layer to an underlying protective layer, in accordance with a preferred embodiment of the invention.

With reference to FIG. 7A, the imprinted patterns 860 and 870, comprising to pitch multiplied and non-pitch multiplied features, respectively, are transferred from the transfer layer 850 to the protective layer 840. Initially, the residual portion 875 of the transfer layer 850 is removed by applying an etch, preferably an anisotropic etch, to the transfer layer 850, which also lowers the thickness of all features, including patterns 860 and 870. Next, an anisotropic etch is performed to define the imprinted patterns 860 and 870 in the protective layer 840. The transfer layer 850 and the protective layer 840 are preferably selectively etched using an anisotropic etch, using, e.g., a $HBr/O_2$ plasma or a $SO_2$-containing plasma. If the transfer layer 850 and the protective layer 840 are both organic, as in the illustrated embodiment, the selective anisotropic etch can simultaneously remove the residual portion 875 of the transfer layer 850 and the subsequent uncovered (etched) portions of the protective layer 840, thereby transferring the imprinted patterns 860 and 870 to the protective layer 840.

Figure 7B:
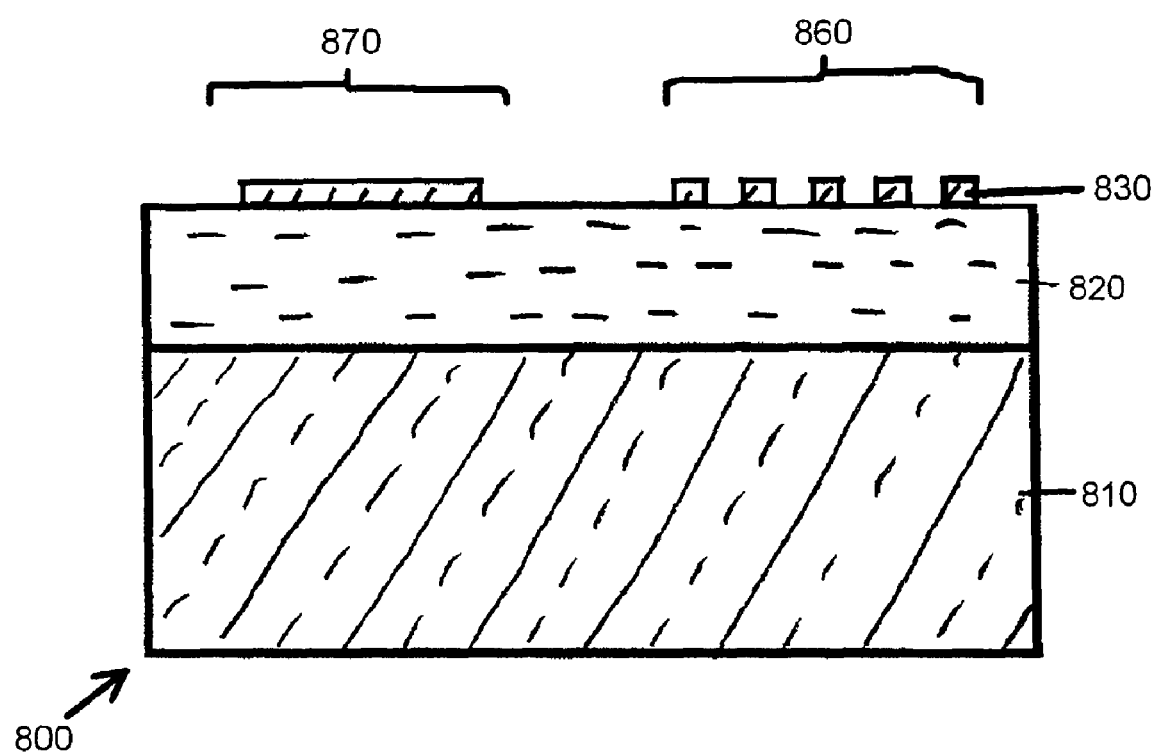
FIG. 7B is a schematic, cross-sectional side view of the partially formed integrated circuit of FIG. 7A after transferring the imprinted pattern from the protective layer to an underlying hard mask layer, in accordance with a preferred embodiment of the invention.

With reference to FIG. 7B, the imprinted patterns 860 and 870 are simultaneously transferred from the protective layer 840 to the hard mask layer 830. The pattern transfer is preferably accomplished using an anisotropic etch, such as an etch using a fluorocarbon plasma. Preferred fluorocarbon plasma etch chemistries include $CFH_3CF_2H_2$ and $CF_3H$.

In some cases, performing an etch through the transfer layer 850 can result in polymerization of the transfer layer 850 material. This polymerization can leave deposits around pattern features, thereby distorting features of the imprinted patterns 860 and 870. This distortion can be particularly problematic given the small pitches for which pitch multiplication is typically used. As a result, after etching the imprinted patterns 860 and 870 into the hard mask layer 830, a cleaning step may be performed to remove the transfer layer 850 and protective layer 840, and any polymerized transfer layer 850 material. If the protective layer 840 and the transfer layer 850 are made of an organic material and the hard mask layer is made of an inorganic material, as in the illustrated embodiment, the transfer layer 850 and the protective layer 840 are removed using, e.g., an isotropic etch with $O_2$ plasma.

Because the transfer layer 850, the protective layer 840 and the underlying primary mask layer 820 are preferably all carbon-based materials, this cleaning step can undesirably etch the primary mask layer 820. This is especially a concern where the cleaning is accomplished using an isotropic etch, which can etch the primary mask layer 820 uncontrollably and typically does not form well-defined features. Thus, an additional hard mask layer (not shown) underlying the hard mask layer 830 may be used to protect the primary mask layer 820 during the cleaning step.

Figure 7C:
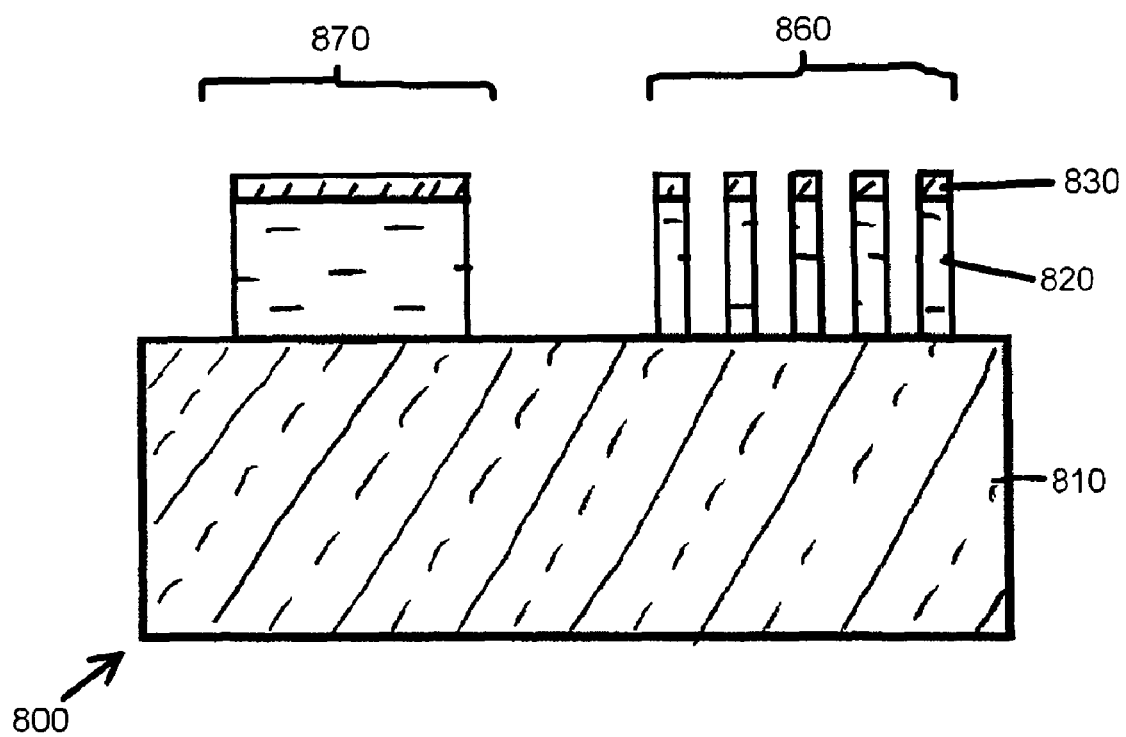
FIG. 7C is a schematic, cross-sectional side view of the partially formed integrated circuit of FIG. 7B after transferring the imprinted pattern from the hard mask layer to a primary mask layer, in accordance with a preferred embodiment of the invention.

With reference to FIG. 7C, the imprinted patterns 860 and 870 are transferred down to the primary mask layer 820. To transfer the patterns 860 and 870 to the primary mask layer 820, the primary mask layer 820 is anisotropically etched, preferably using a $SO_2$-containing plasma, which can simultaneously remove any remaining transfer layer 850 and protective layer 840 material that was not removed in the previous step. Other suitable etch chemistries include a $Cl_2/O_2$, $HBr/O_2/N_2$, $SiCl_4/O_2/N_2/HBr$, $SiCl_4/O_2$ etch recipes and other oxygen-containing plasmas. However, the $SO_2$-containing plasma is preferably used as it has been found to have excellent selectivity for the amorphous carbon of the primary mask layer 820 relative to the inorganic hard mask layer 830.

Figure 7D:
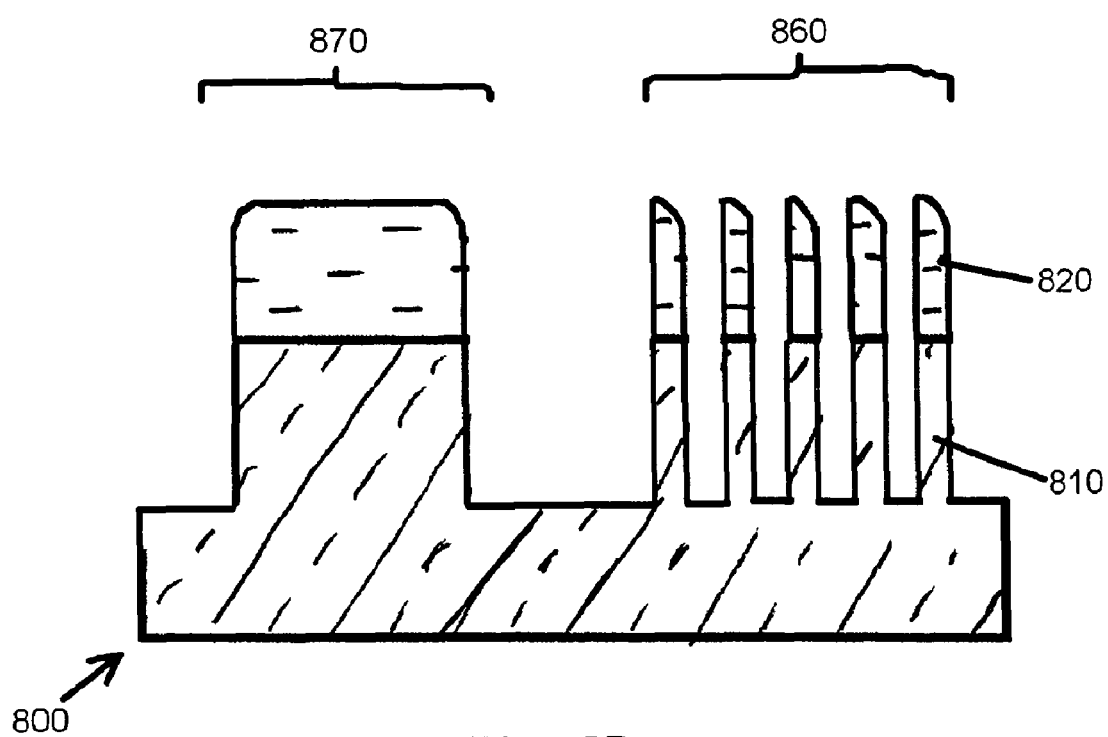
FIG. 7D is a schematic, cross-sectional side view of the partially formed integrated circuit of FIG. 7C after transferring the imprinted pattern from the primary mask layer to the second substrate, in accordance with a preferred embodiment of the invention.

With reference to FIG. 7D, the imprinted patterns 860 and 870 are then preferably transferred from the primary mask layer 820 to the underlying substrate 810 in a single step. The imprinted patterns 860 and 870 are transferred to the substrate 810 using the imprinted patterns 860 and 870 in the primary mask layer 820 as a mask. The pattern transfer can be readily accomplished using conventional etches appropriate for the material or materials of the substrate 810. Advantageously, any etch chemistry appropriate for the substrate material(s) can be used. For example, where the substrate comprises an insulator, such as silicon oxide, a fluorocarbon etch comprising $CF_4$ or $C_2F_6$ can be used to etch the substrate. Where the substrate comprises a polysilicon layer at an upper surface, a $HBr/Cl_2$ etch can be used. In addition, the skilled artisan can readily determine suitable etch chemistries for other substrate materials, such as conductors, including aluminum, transition metals, and transition metal nitrides. For example, an aluminum layer can be etched using an HCl etch.

Where the substrate 810 comprises layers of different materials, a succession of different chemistries, preferably dry-etch chemistries, can be used to successively etch through the different layers. It will be appreciated that, depending upon the chemistry or chemistries used, the hard mask layer 830 may be etched, as shown in FIG. 7D. The amorphous carbon of the primary mask layer 820, however, advantageously offers excellent resistance to conventional etch chemistries, especially those used for etching silicon-containing materials such as silicon, silicon nitride, or silicon oxide. Accordingly, the primary mask layer 820 can be effectively used as a mask for etching through a plurality of substrate layers, or for forming high aspect ratio trenches or spaces.

Figure 8:
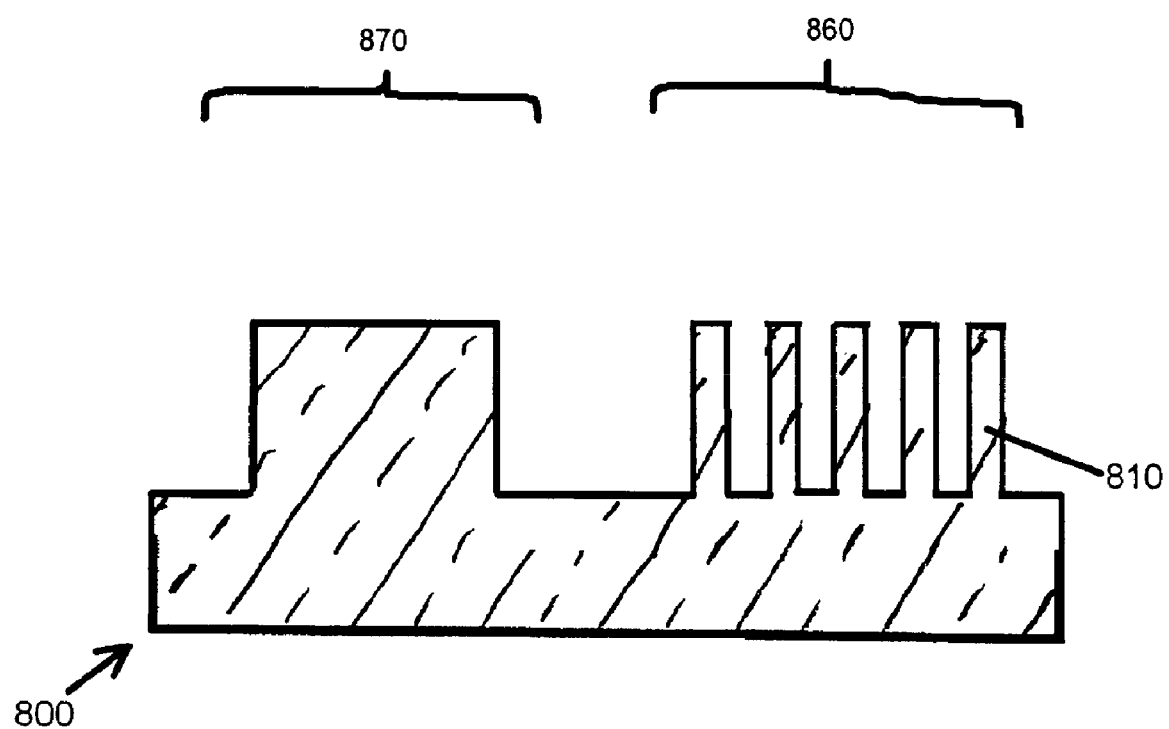
FIG. 8 is a schematic, cross-sectional side view of the partially formed integrated circuit of FIG. 7D after removing the primary mask layer overlying the second substrate, in accordance with a preferred embodiment of the invention.

With reference to FIG. 8, the primary mask layer 820 can be later removed for further processing of the substrate 810. Removal of the primary mask layer 820 can be accomplished using chemical mechanical polishing (CMP) or a selective carbon etch (e.g., oxygen-based plasma).

Thus, imprinted patterns 860 and 870, which include pitch multiplied and non-pitch multiplied features, respectively, are formed on the substrate 810. The imprinted patterns 860 and 870 in the substrate 810 are negative images of the patterns 760 and 770, respectively, in the template 750. Further, the imprinted patterns 860 and 870 in the substrate 810 are positive images of the pattern 320 and 330, respectively, in the first substrate 200. Since portions of the non-pitch multiplied features can overlap the pitch multiplied features, and the degree of overlap can vary depending on application, overlapping features of different sizes on both sides of the photolithographic limit, such as conducting lines and landing pads or periphery transistors can advantageously be formed on a semiconductor device 800.

In addition, the preferred embodiment can be employed multiple times throughout an imprint lithography process to form a plurality of patterns in or on a semiconductor wafer, e.g., at different levels. The plurality of patterns can be configured to produce memory cell arrays for volatile and non-volatile memory devices such as DRAM, ROM or flash memory, including NAND flash memory, or integrated circuits having logic or gate arrays.

Thus, according to one aspect, a template is provided for use in imprint lithography. The template includes a first pattern comprising pitch multiplied features and a second pattern comprising non-pitch multiplied features.

According to another aspect, a method is provided for forming a template for use in imprint lithography. The method comprises forming a first mask with pitch multiplication over a substrate, the first mask defining a first pattern. A second mask is formed separately by photolithography over the substrate, the second mask defining a second pattern. The first pattern and the second pattern are transferred to the substrate. The first pattern and the second pattern are transferred from the substrate to the template configured for use in imprint lithography.

According to yet another aspect, a method is provided for imprinting a pattern using a template in imprint lithography. The method comprises forming a first mask by pitch multiplication over a first substrate, the first mask defining a first pattern. A second mask is separately formed by photolithography over the first substrate, the second mask defining a second pattern. The first pattern and the second pattern are transferred to the first substrate. The first pattern and the second pattern are transferred from the first substrate to a template. The first pattern and the second pattern in the template are imprinted into a transfer layer overlying a second substrate. The first pattern and the second pattern are transferred from the transfer layer overlying the second substrate to the second substrate.

According to yet another aspect, a method is provided for imprinting a pattern using a template in imprint lithography. The method comprises providing a template including two patterns, wherein at least one of the patterns is pitch multiplied. The first pattern and the second pattern in the template are imprinted into a transfer layer overlying a substrate. The first pattern and the second pattern are transferred from the transfer layer overlying the substrate to the substrate.

It will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method for forming a template for use in imprint lithography, comprising:

forming a first mask with pitch multiplication over a substrate, the first mask defining a first pattern;

separately forming a second mask by photolithography over the substrate, the second mask defining a second pattern;

transferring the first pattern and the second pattern to the substrate; and transferring the first pattern and the second pattern from the substrate to the template configured for use in imprint lithography.

2. The method of claim 1, wherein transferring the first pattern and the second pattern from the substrate to the template comprises bringing the substrate in contact with a plate.

3. The method of claim 2, wherein bringing the substrate in contact with a plate comprises forming an adhesive layer bonded to the substrate and the plate.

4. The method of claim 1, wherein transferring the first pattern and the second pattern from the substrate to the template comprises forming a substantially planar layer in contact with the substrate.

5. The method of claim 4, further comprising bonding a plate to the planar layer over the substrate.

6. The method of claim 5, wherein bonding a plate to the planar layer over the substrate comprises forming an adhesive layer bonded to the planar layer and the plate.

7. The method of claim 5, further comprising etching the substrate from the substantially planar layer after bonding the plate to the planar layer.

8. The method of claim 1, wherein forming the first mask with pitch multiplication comprises:
   providing a plurality of mandrels on the substrate;
   depositing a layer of spacer material over the mandrels on the substrate;
   anisotropically etching the spacer material to form spacers; and
   selectively removing the mandrels, wherein the spacers correspond to the first pattern.

* * * * *